(12) United States Patent
Johnson et al.

(10) Patent No.: US 6,740,853 B1
(45) Date of Patent: May 25, 2004

(54) MULTI-ZONE RESISTANCE HEATER

(75) Inventors: Wayne L. Johnson, Phoenix, AZ (US); Eric J. Strang, Chandler, AZ (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/088,504

(22) PCT Filed: Sep. 18, 2000

(86) PCT No.: PCT/US00/25503

§ 371 (c)(1),
(2), (4) Date: Sep. 17, 2002

(87) PCT Pub. No.: WO01/24581

PCT Pub. Date: Apr. 5, 2001

Related U.S. Application Data
(60) Provisional application No. 60/156,595, filed on Sep. 29, 1999.

(51) Int. Cl.[7] .................................................. H05B 3/68
(52) U.S. Cl. .............................. 219/444.1; 219/443.1; 219/446.1; 219/468.1; 219/542; 219/543; 118/620; 118/621; 118/725; 118/730; 361/233; 361/234
(58) Field of Search .......................... 219/444.1, 443.1, 219/446.1, 468.1, 542–544; 118/620–621, 725, 728–730; 361/233, 234

(56) References Cited

U.S. PATENT DOCUMENTS

| | | | |
|---|---|---|---|
| 3,110,795 A | 11/1963 | Bremer | |
| 5,059,770 A | 10/1991 | Mahawili | |
| 5,376,213 A | 12/1994 | Ueda et al. | |
| 5,436,790 A * | 7/1995 | Blake et al. | 361/234 |
| 5,460,684 A | 10/1995 | Saeki et al. | |
| 5,665,166 A | 9/1997 | Deguchi et al. | |
| 5,854,468 A | 12/1998 | Muka | |
| 5,880,923 A * | 3/1999 | Hausmann | 361/234 |
| 5,886,864 A | 3/1999 | Dvorsky | |
| 5,904,872 A | 5/1999 | Arami et al. | |
| 6,107,608 A * | 8/2000 | Hayes | 19/444.1 |
| 6,147,334 A | 11/2000 | Hannigan | |

* cited by examiner

*Primary Examiner*—Shawntina Fuqua
(74) *Attorney, Agent, or Firm*—Oblon, Spivak, McClelland, Maier & Neustadt, P.C.

(57) ABSTRACT

A substrate holder for holding a substrate (e.g., a wafer or an LCD panel) during plasma processing. The substrate holder is a stack of processing elements which each perform at least one function. The elements include an electrostatic chuck (102), an He gas distribution system (122), multi-zone heating plates (132), and multi-zone cooling system (152). Each element is designed to match the characteristic of the processing system, e.g., by applying heat based on a heat loss characteristic of the substrate during normal processing. The integrated design allows for precise control of the operating conditions, including, but not limited to, fast heating and fast cooling of a substrate.

43 Claims, 35 Drawing Sheets

COVER PLATE

PRIMARY PLATE

BASE PLATE

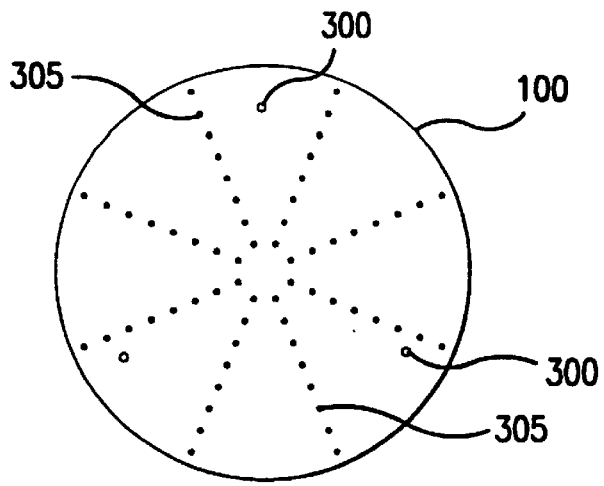
FIG.3A
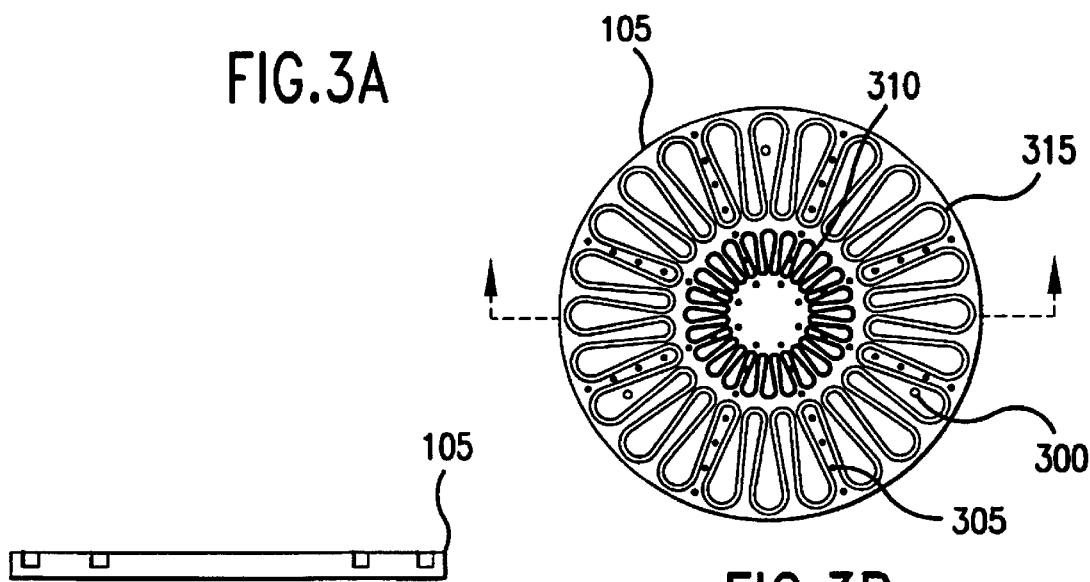
FIG.3C
FIG.3B
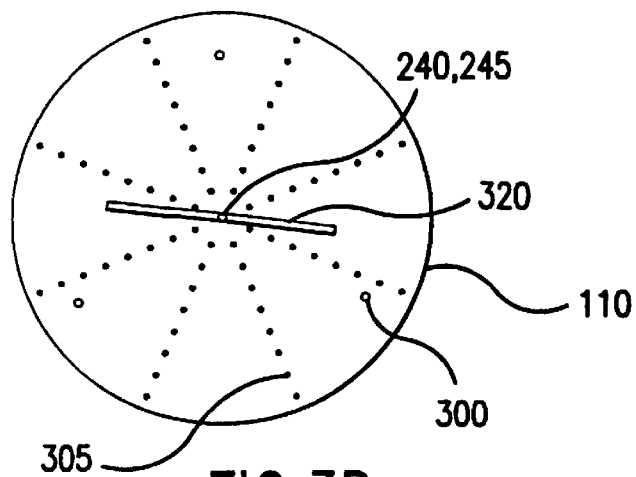
FIG.3D

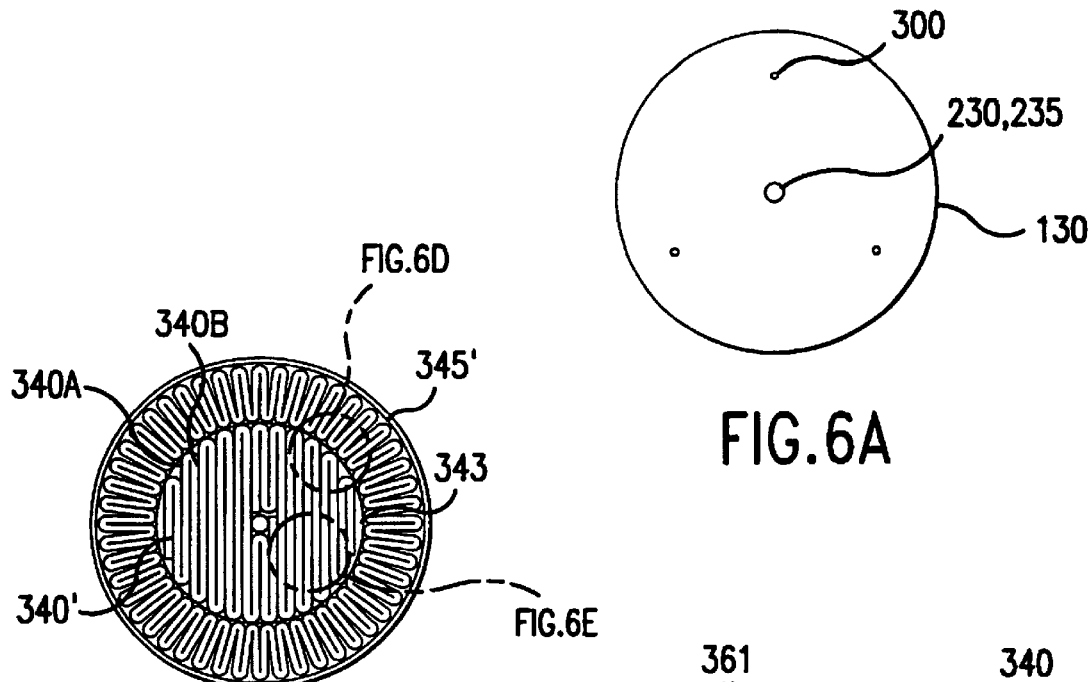
FIG.6A
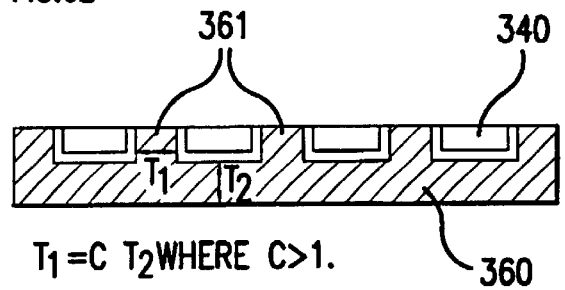
$T_1 = C\, T_2$ WHERE $C > 1$.
FIG.6E
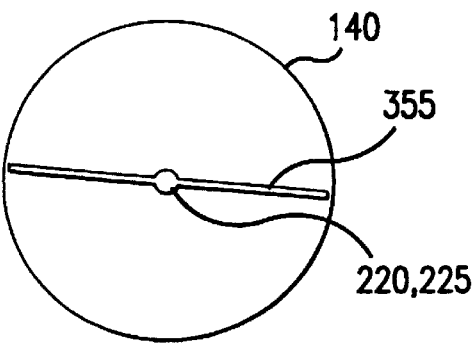
FIG.6B
FIG.6C
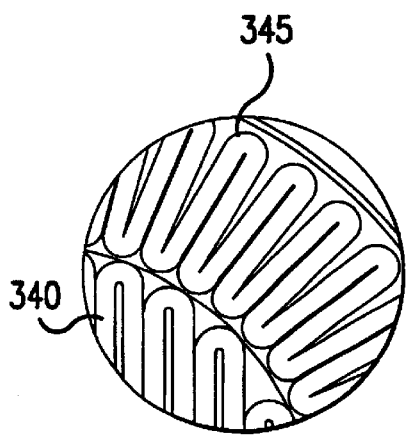
FIG.6D

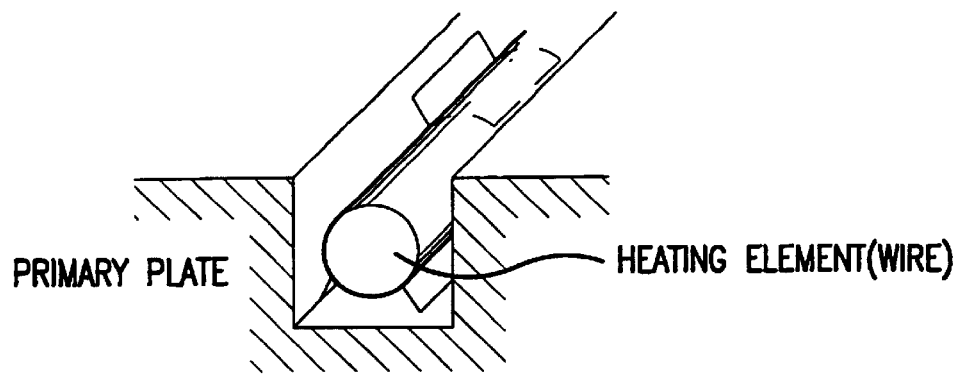
FIG.8E
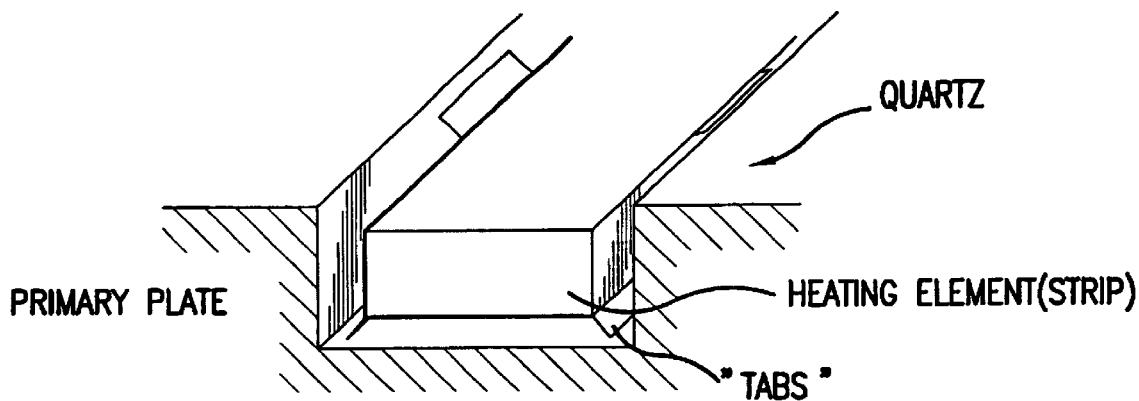
FIG.8F(1)
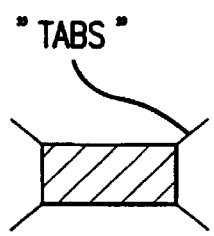
FRONT VIEW
(CROSS-SECTION)
FIG.8F(2)
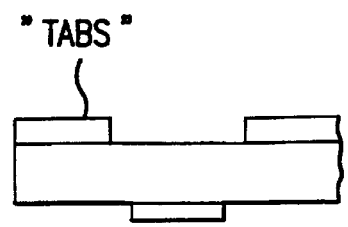
SIDE VIEW
FIG.8F(3)

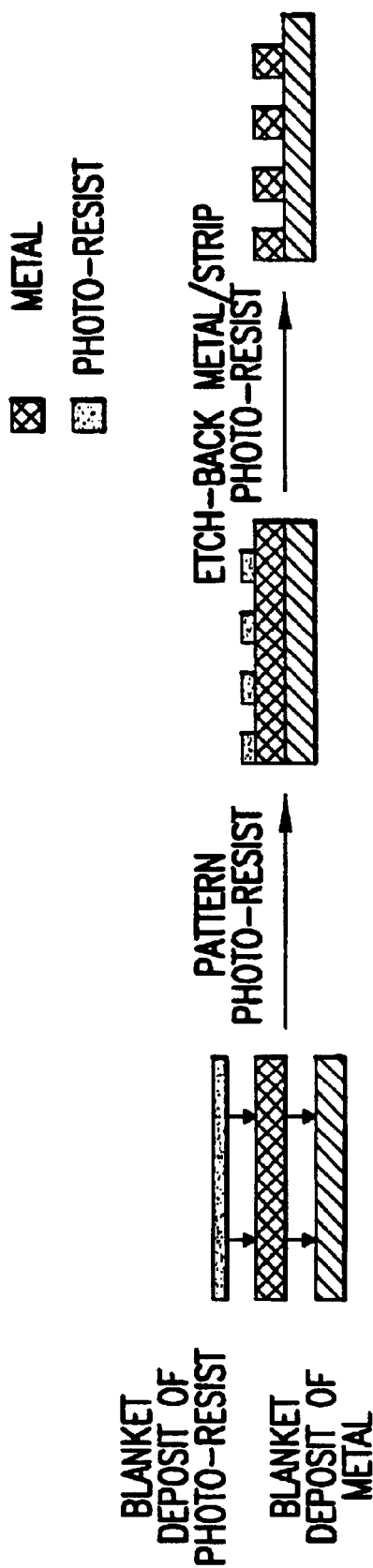
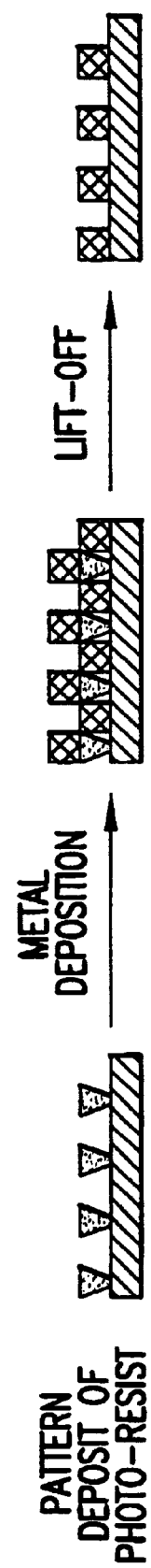
FIG.16B(1)
FIG.16B(2)

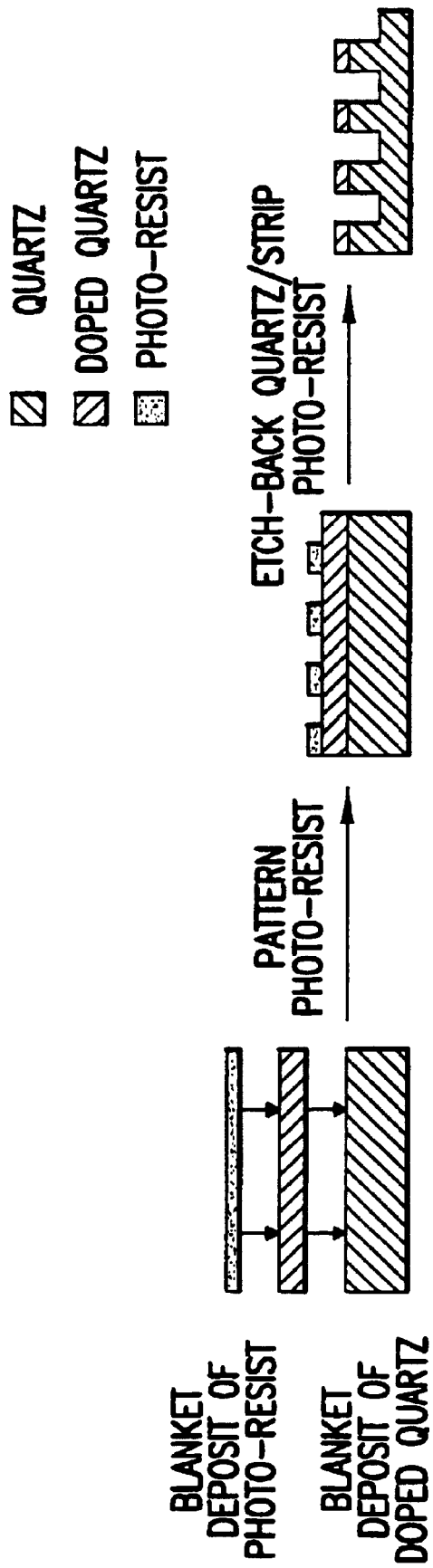

HIGH TEMPERATURE DIFFUSION BOND

MULTI-ZONE RESISTANCE HEATER

CROSS-REFERENCE TO RELATED APPLICATIONS

The present application claims priority to and is related to application Ser. No. 60/156,595, filed Sep. 29, 1999, the contents of which are incorporated herein by reference.

BACKGROUND OF THE INVENTION

1. Field of the Invention

The present invention relates generally to a multi-purpose wafer holder for holding a wafer (or other substrate) during processing in a plasma system. More specifically, the holder includes at least one stacked layer to provide clamping, conduction, heating and/or cooling. Examples of layers include an electrostatic chuck, a multi-zone He gas delivery system, a multi-zone resistance heater, and a multi-zone cooling system.

2. Description of the Background

It is known within the semiconductor processing field to use resistance heaters to heat a semiconductor wafer that is in the presence of a processing gas. Heating alters the characteristics of the reaction process occurring on the semiconductor wafer. For example, such resistance heaters have been used within quasi-hot wall, or warm wall, reactors where the resistance heater serves as the support for the silicon wafer and simultaneously heats the wafer to carry out a predetermined processing step. Often, a processing gas of a predetermined purity and/or pressure is circulated over the heated silicon wafer to modify the surface characteristics of the silicon wafer. Chemical vapor deposition is one environment in which such resistance heaters are used to process semiconductor wafers.

Such resistance heaters have typically employed heating elements of (1) a nickel-chromium alloy (nichrome) or (2) an aluminum-iron alloy, which are electrically resistive and which generate heat when an electrical current is applied through the elements. Examples of commercially available materials commonly used to fabricate resistive heating elements employed in ovens are Kanthal, Nikrothal and Alkrothal, which are registered trademark names for metal alloys produced by Kanthal Corporation of Bethel, Conn. The Kanthal family includes ferritic alloys (FeCrAl) and the Nikrothal family includes austenitic alloys (NiCr, NiCrFe).

However, resistance heater elements have not, in the past, been exposed to the processing gas that is circulated over the silicon wafer within the reactor. Moreover, large heater elements with large thermal masses have been required to provide a barrier of material between the wafer and the heater elements when heating in known plasma systems. Known electrically resistive materials, such as some of the Kanthal alloys, require an oxygenated environment for long element life. The presence of oxygen causes an aluminum oxide to form upon the surface of a Kanthal alloy heater element which inhibits evaporation of the heater element. An acceptable level of oxygen is 5% of 760 torr with no other gases which react to the alloy surface. Alternatively, environments with less oxygen can cause the oxide layer to become porous and allows iron oxide to migrate along grain boundaries, causing contamination of the system.

Traditionally, the heater elements of wafer processing systems also have had thermal masses that are significantly greater than the wafer or substrate that they have heated. In known systems, heater elements weighing tens of pounds have been used to heat wafers weighing only two ounces. As a result of the large thermal mass, the heater has a pronounced lateral profile which heats a wafer much more in the center region than compared to the edge region of the wafer. In order to compensate for the thermal profile, complicated devices having on the order of 30 parts were used in known systems to adjust the applied heat. A large thermal mass also leads to a high thermal inertia—an effect where the heater element continues to apply heat to the wafer (or other substrate) after the wafer has already achieved its desired temperature. Also, in known systems, radial or lateral heat transfer has been higher than in the substrate being processed, making it harder to isolate changes in temperature in the wafer.

SUMMARY OF THE INVENTION

Accordingly, it is an object of the present invention to provide a wafer holder that is fabricated as a stack of at least one element, each element performing at least one wafer processing function.

It is a further object of the present invention to provide an improved wafer chuck using electrostatic clamping to provide a more uniform thermal conduction of a wafer than a non-electrostatically clamped wafer.

It is yet another object of the present invention to measure the effective clamping of a wafer to the electrostatic chuck by measuring the capacitance of (1) the wafer and (2) two adjacent electrodes housed inside the chuck that provide the clamping.

It is an additional object of the present invention to provide an He gas delivery system (known as a Helium back side) for increasing conduction to a wafer.

It is a further object of the present invention to provide a multi-zone He gas delivery system for increasing conduction in one region of a wafer more than in another region of the wafer by providing different pressures in the different zones.

It is another object of the present invention to provide a resistance heater for heating a semiconductor wafer within a wafer processing reactor wherein the processing gas circulated about the wafer is isolated from the resistance heater element.

It is another object of the present invention to provide a resistance heater which utilizes materials such as Kanthal alloys, Hastaloy, platinum, and molybdenum.

It is yet another object of the present invention to provide an oxygenated environment for those high resistance heater elements which would otherwise degrade in a low oxygen environment.

It is still another object of the present invention to provide such a resistance heater having multiple heating zones for better control of temperature uniformity.

It is a further object of the present invention to provide a resistance heater where the gas environment surrounding the heater element differs from and is completely isolated from the gas environment within the semiconductor wafer reactor.

It is another object of the present invention to measure the heat transfer characteristic of a substrate to be heated and to provide a resistance heater which is designed to apply additional heat to areas which have higher heat loss.

It is a further object of the present invention to provide a resistance heater configured to provide uniform heating across a non-circular element to be heated.

It is an additional object of the present invention to provide a resistance heater with a thermal mass closely equivalent to the thermal mass of the wafer to be heated.

It is an object of the present invention to provide a cooling system to reduce the temperature of a substrate before, during or after a plasma process.

It is an additional object of the present invention to provide a multi-zone cooling system that cools a wafer before, during or after a plasma processing step according to a heat loss pattern of the wafer.

It is another object of the present invention to provide a combined stack of more than one of the above elements (i.e., more than one of a multi-zone electrostatic chuck, a multi-zone He gas delivery system, a multi-zone resistance heater, and a multi-zone cooling system).

Briefly described, and in accordance with a first embodiment, the present invention relates to a stack of elements onto which a substrate (e.g., a wafer or an LCD panel) can be placed during a series of one or more plasma or thermal processing steps. The types of elements in the stack include, but are not limited to: an electrostatic clamp (either single- or multi-zone), a He gas delivery system (either single- or multi-zone), a resistance heater (either single- or multi-zone), and/or a cooling system (either single- or multi-zone). At least one of the elements is selected based on the processing step(s) to be performed. Each element is hermetically sealed from each other element and from the processing environment. Accordingly, one embodiment of the present invention acts as more than one of: an electrostatic chuck with electrostatic clamping, a resistance heater, and a cooling system.

According to one embodiment of the present invention, an electrostatic chuck is provided which clamps a substrate thereto and enables the clamping of the substrate to be measured. In this embodiment, first and second electrodes are housed internal to the electrostatic chuck and clamp the substrate to the chuck. The capacitance between the first and second electrodes is measured after the substrate is applied to the chuck to determine the effective clamping of the substrate.

According to another embodiment of the present invention, plural sealed plates are used together to provide pressure control for an He gas delivery system on the back side of the substrate in a plasma processing chamber. The Helium gas delivery system provides He to the back side of a substrate at a pressure significantly greater than the chamber (processing) pressure (i.e., typically 30–50 Torr) in order to improve the conduction of heat between the substrate and the chuck. Electrically clamping the substrate to the chuck enables using a back side gas pressure substantially greater then the chamber pressure. The area of the substrate and chuck are smooth enough that they provide a good gas seal. In one embodiment, the He gas delivery system is zoned to provide different amounts of He to different parts of the substrate in order to match a conduction profile of the substrate. The He gas delivery system may be used in combination with the above-described electrostatic chuck. In one embodiment of the combination, the electrostatic chuck includes gas holes and the He gas delivery system is placed below the electrostatic chuck. The He gas then passes through the holes in the electrostatic chuck to provide conduction to the wafer. The gas conduction varies directly with pressure (e.g., up to 15 torr).

According to another embodiment of the present invention, a resistance heater is provided for heating a semiconductor wafer within a wafer processing reactor. The heater includes a resistance heater element disposed in a heater channel formed in one or more quartz plates. One embodiment of the resistance heater includes heater channels with supply end head room to accommodate expansion and contraction of the heater element which occurs during heating and cooling.

The quartz plates forming the housing for the resistance heater are fused together at plural adjoining surfaces and preferably at all adjoining surfaces. The resistance heater element is secured therebetween to form a gas-tight chamber. A sufficient number of fusion points are provided to prevent the internal pressure of the resistance heater from popping the fusion points when in the reduced pressure atmosphere of the plasma processing chamber. Electrical terminals coupled to the resistance heater element are provided for conducting electrical current. In at least one embodiment, a gas duct is connected to the gas-tight chamber formed between the quartz plates for admitting gas(es) of predetermined composition(s) and pressure(s) thereto independent of the composition and pressure of the processing gas circulating about the external face of the wafer holder.

Preferably, the resistance heater element is formed of a material such as a Kanthal alloy or platinum, since those materials can be heated in air without damage. A sheet of material may be melted, drawn, chemically etched, sputtered, laser cut, cut with a water jet, or otherwise shaped to form a resistance heater element matching the heat transfer characteristics of the element to be heated. Alternatively, one or more wires of one or more of the above materials may be used as the heater element. The quartz plates are constructed to have features matching the heater elements. The features, when fused together, provide a hermetic seal to separate the processing environment from the gas over the conductor. The seals must reliably accommodate the ultra-high temperatures of the heater.

To provide a resistance heater element with a shape corresponding to the heat loss of the element to be heated, the thermal transfer characteristics are examined using at least one of the three disclosed techniques. In a first technique, changes in an LCD paper are examined when the LCD paper is applied to a previously uniformly heated substrate which is placed on an electrostatic chuck. Photographs of the changes in the paper indicate the shape of the heat loss of the heated substrate. In a second technique, an infrared scanner or detector measures the changes in heat emissions across the surface of a previously heated substrate as it cools on the chuck. One such detector that monitors spatially and temporally evolving temperature in the absence of a plasma is a commercially available wafer instrumented with thermocouples (e.g., SensArray Corporation, Model No. 1530A). In the third technique, the transfer characteristics of a substrate on a chuck are simulated by a computer based on the shapes and thermal characteristics of the substrates to be heated and the shape and heat transfer characteristics of the chuck on which the substrate is heated.

Also provided according to the present invention is a set of cooling plates for one or more of: (1) cooling a substrate before processing, (2) maintaining a cool temperature of the substrate during processing and (3) cooling the substrate after processing is complete. One embodiment of the cooling system is a multi-zone cooling system that cools a substrate according to a heat loss characteristic of the substrate. By applying coolant more rapidly in areas that would otherwise cool more slowly, the substrate is more uniformly cooled. Also, by reducing the substrate temperature quickly after processing, any temperature-based reactions are more effectively halted at a process end-point.

BRIEF DESCRIPTION OF THE DRAWINGS

A more complete appreciation of the invention and many of the attendant advantages thereof will become readily apparent to those skilled in the art with reference to the following detailed description, particularly when considered in conjunction with the accompanying drawings, in which:

FIG. 1I is a top view of a focus ring on top of the wafer holder implemented using the individual sections of FIG. 1H;

FIG. 3A is a top view of a top plate of an electrostatic chuck according to a first embodiment;

FIG. 3B is a top view of a middle plate of the electrostatic chuck according to a first embodiment;

FIG. 3C is a cross section of the middle plate of the electrostatic chuck according to a first embodiment;

FIG. 3D is a top view of a bottom plate of the electrostatic chuck according to a first embodiment;

FIG. 6A is a top view of a top plate of an electrical resistance heater;

FIG. 6B is a top view of a middle plate of an electrical resistance heater having an inner zone and an outer zone according to a second implementation;

FIG. 6C is a top view of a bottom plate of an electrical resistance heater;

FIG. 6D is an expanded top view of a portion of the middle plate according to the second implementation;

FIG. 6E is a cross section of a portion of the inner zone of the middle plate according to the second implementation;

FIG. 8E is a schematic illustration of a wire heating element resting on supports within a channel;

FIG. 8F(1) is a schematic illustration of a strip heating element resting on tabs within a substantially rectangular channel;

FIG. 8F(2) is a front view cross-section of the tabs on which a strip heating element rests when the strip is within a substantially rectangular channel;

FIG. 8F(3) is a side view of the tabs on which a strip heating element rests when the strip is within a substantially rectangular channel;

FIGS. 16A through 16D illustrate methods of manufacturing layers of the present invention.

DETAILED DESCRIPTION OF THE PREFERRED EMBODIMENTS

Figure 1A:
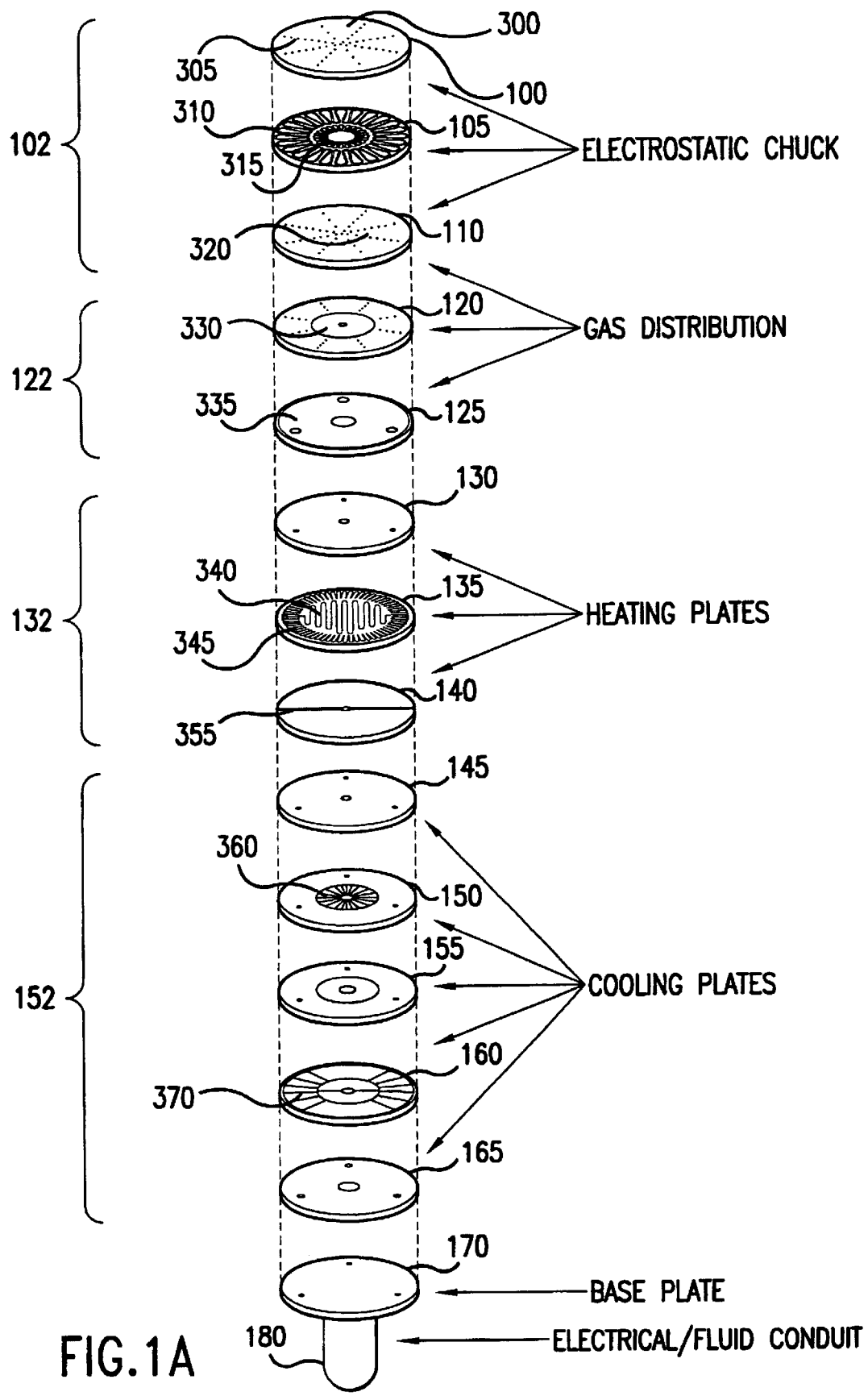
FIG. 1A is a cross-section of a complete wafer holder implementing a stack of a multi-zone electrostatic chuck, a multi-zone He gas distribution system, a multi-zone resistance heater, and multi-zone cooling system.

Referring now to the drawings, wherein like reference numerals designate identical or corresponding parts throughout the several views, FIG. 1A illustrates a preferred embodiment of a stack of elements. The stack operates as a combined electrostatic chuck 102, He distribution system 122, electrical resistance heater 132, and cooling assembly 152, in accordance with the present invention. In the stacked configuration shown, from top to bottom, the first three plates (100, 105, and 110) comprise the electrostatic chuck 102, the next two plates (120 and 125) comprise the He gas distribution system 122, the next three plates (130, 135, and 140) comprise the electrical resistance heater 132, and the last five plates (145,150,155, 160, and 165) comprise the cooling system 152. In an alternate embodiment, plural plates are combined to form one or more "super-plates" with the same functionality as the plates which the super-plates replace. For example, when an He gas distribution system 122 is used in conjunction with an electrostatic chuck, the bottom-most plate 110 of the electrostatic chuck 102 can be combined with the top plate 120 of the He gas distribution system. Likewise, the bottom plate 125 of the He gas distribution system 122 can be combined with the top plate 130 of the electrical resistance heater 132. All thirteen plates are stacked concentrically on top of each other and rest on a base plate 170 attached to an electrical/fluid conduit 180.

Figure 1B:
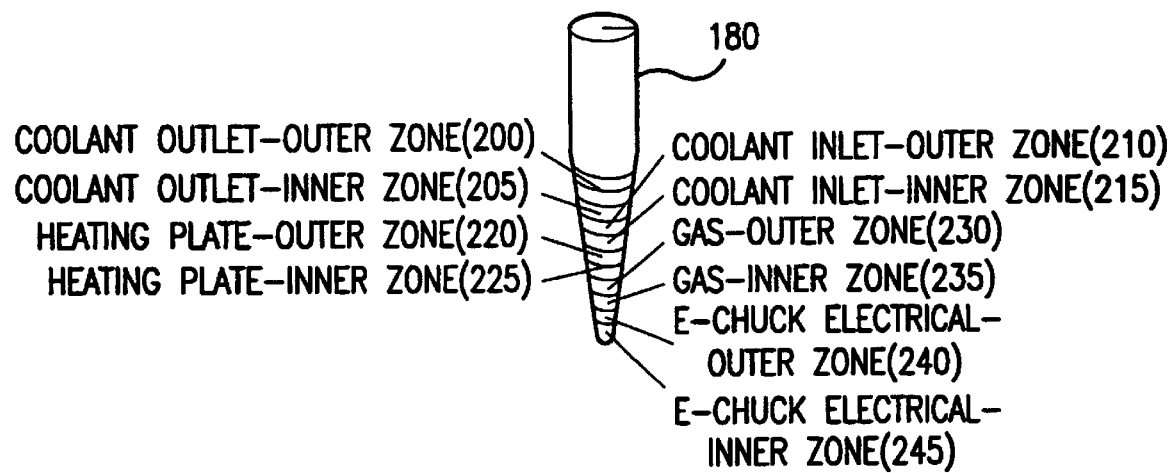
FIG. 1B is a side view of a first electrical/fluid conduit for passing electrical connections, gas, and coolant to the different layers shown in FIG. 1A.

As shown in FIG. 1B, in one implementation of the electrical/fluid conduit 180, ten distinct zones are arranged concentrically. Each zone transports at least one of an electrical signal, a gas, and a coolant to the various layers. In an exemplary embodiment of the electrical/fluid conduit 180, zones are arranged from an exterior to an interior in an order as follows: coolant outlet-outer zone 200, coolant outlet-inner zone 205, coolant inlet-outer zone 210, coolant inlet-inner zone 215, heating plate-outer zone 220, heating plate-inner zone 225, He gas outer zone 230, He gas-inner zone 235, electrostatic chuck electrical wiring-outer zone 240, and electrostatic chuck electrical inner zone 245. However, the embodiment shown is only exemplary, and the order of the inner and outer zones and the order of the inlets and outlets can be changed without departing from the spirit of the present invention.

Figure 1C:
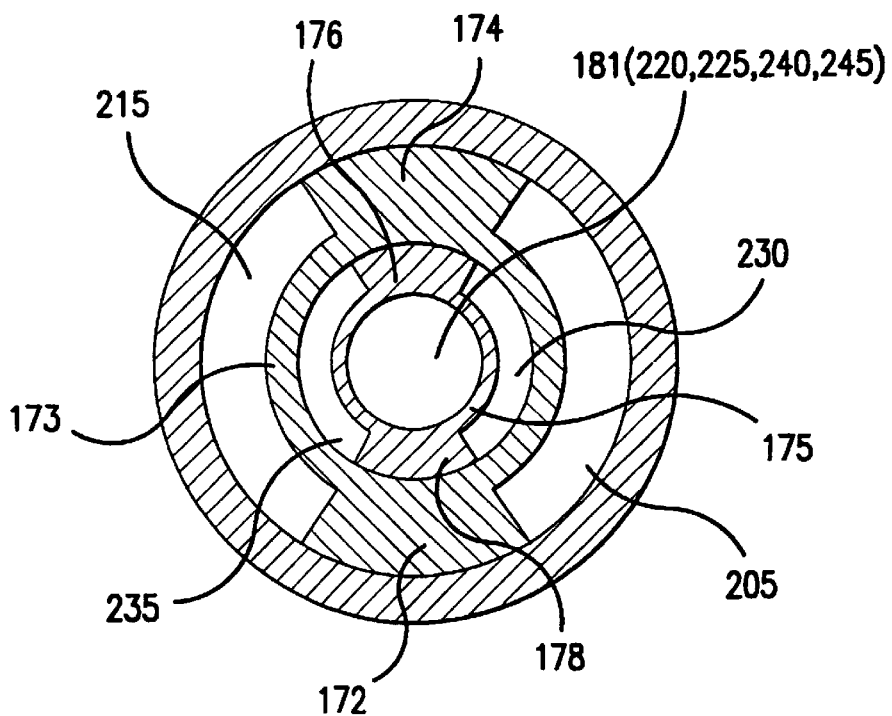
FIG. 1C is a cross section of a second electrical/fluid conduit for passing the electrical connections, the gas, and the coolant to the different layers shown in FIG. 1A.
Figure 10A:
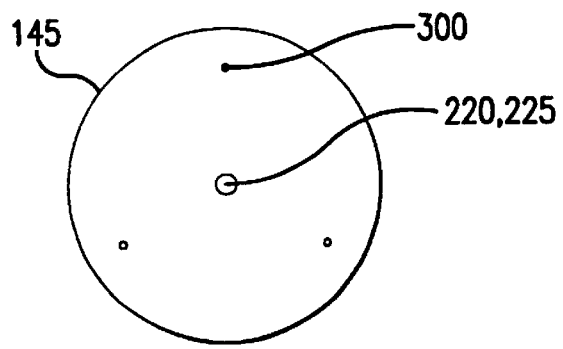
FIG. 10A is a top view of a top plate of a cooling system according to a second implementation.
Figure 10B:
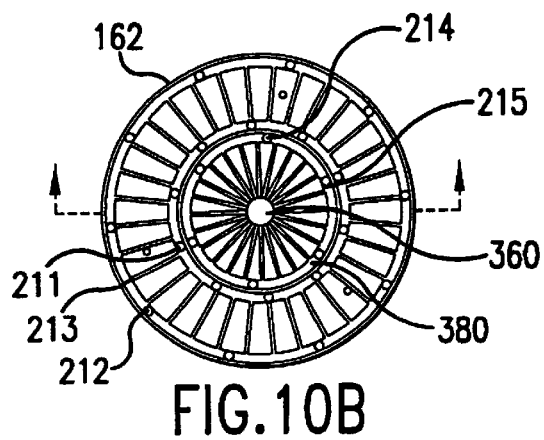
FIG. 10B is a top view of a second plate of a cooling system according to the second implementation.
Figure 10C:
FIG. 10C is a cross section of the second plate of the cooling system shown in FIG. 10B.
Figure 10D:
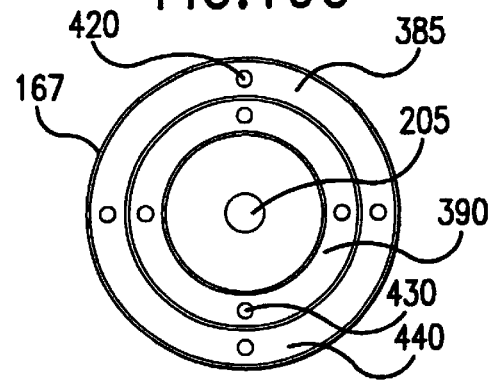
FIG. 10D is a top view of a third plate of a cooling system according to the second implementation.
Figure 10E:
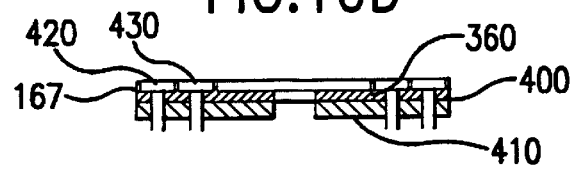
FIG. 10E is a cross section of the third plate of the cooling system shown in FIG. 10D including a reflective material and a thermal insulator coupled to the bottom of the third plate.

FIG. 1C shows a second implementation of the electrical/fluid conduit 180 that is used in conjunction with additional inlets and outlets shown in FIG. 10E. In this embodiment, the electrical conduits for the inner zone 245 and the outer zone 240 of the electrostatic chuck 102 are combined with the inner zone 225 and the outer zone 220 of the heating plate 132 to form an electrical conduit 181. The remainder of the conduit 180 includes an inner ring 175 and an outer ring 173. The inner ring, including notches 176 and 178, forms two conduits for the He gas outer zone 230 and the He gas-inner zone 235. The outer ring 173, including notches 172 and 174, forms conduits for the coolant outlet-inner zone 205 and the coolant inlet-inner zone 215. Using this implementation, additional structural rigidity, as compared with the annular regions, is achieved because each inner conduit attaches to an outer conduit. By dividing a ring into two parts, each which can be used for a different purpose, the number of rings is also reduced as compared with the embodiment shown in FIG. 1B. The internal ribbing also enables proper alignment of the concentric conduits, sites for fusing adjacent conduits, and an improved ducting for coolant and gas flow. Although depicted as having all the notches (172, 174, 176, and 178) in alignment in FIG. 1C, the rings 173 and 175 may be rotated such that the notches are at different angles with respect to each other. Similarly, each ring can be divided into a smaller number of hermetically sealed sections to accommodate a different number of zones for each of the layers. For example, if three He gas supply regions are used in the He gas distribution system 122, then the inner ring 175 would contain three sections instead of the illustrated two.

Figure 1D:
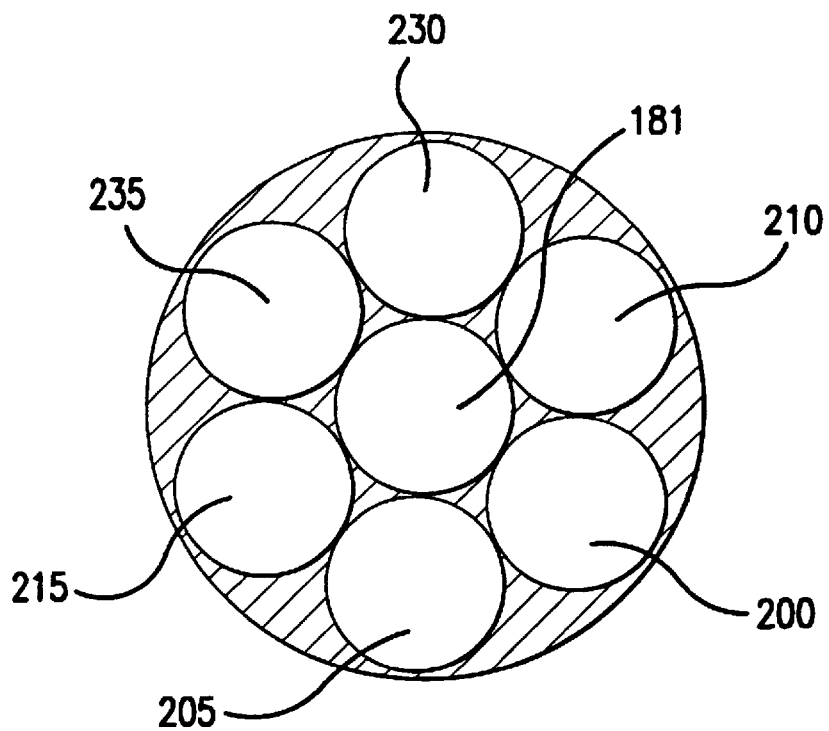
FIG. 1D is a cross section of a third electrical/fluid conduit for passing the electrical connections, the gas, and the coolant to the different layers shown in FIG. 1A.
Figure 1E:
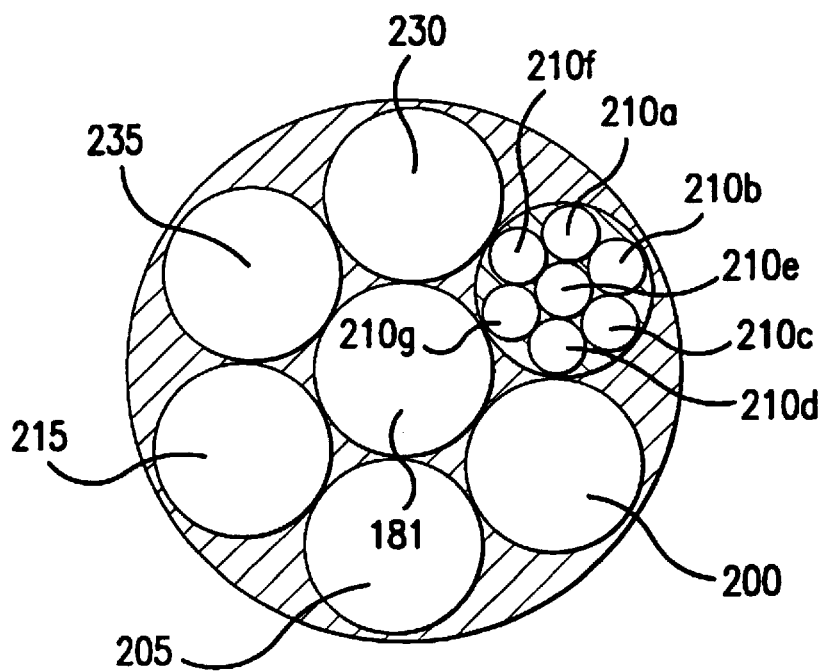
FIG. 1E is a cross section of a fourth electrical/fluid conduit for passing the electrical connections, the gas, and the coolant to the different layers shown in FIG. 1A.

In yet another alternate embodiment shown in FIG. 1D, the conduit 180 is implemented as a bundle of tubes grouped together. In this configuration, the tubes may be (1) constant size throughout the conduit 180 or (2) may increase in volume and be realigned as tubes are no longer needed higher in the stack of quartz plates. For example, although six tubes are shown in the outer ring of FIG. 1D, at least one tube may no longer be needed at a next higher plate since the at least one tube has delivered its payload (e.g., coolant) to the proper plate. Thus, five tubes in the outer ring can continue up the conduit 180. In yet another embodiment of the conduits, smaller conduits may be contained within larger conduits. In one such embodiment, a structure similar to FIG. 1D may itself be enclosed in a circular conduit, creating the configuration of FIG. 1E.

Each of the plates shown in FIG. 1A are formed of a thermally conductive but electrically insulating layer (e.g., quartz) and are joined to the corresponding conduit structures in FIGS. 1B–1E using "frit" as a bonding agent. Before bonding, the wires are run through the conduits, and then the frit is placed on the plates around the holes and at each adjacent edge between plates. To manufacture the frit, a dopant is placed in ground quartz to lower its melting temperature. The portions to be bonded are then assembled under mechanical pressure in a kiln and are fired in air to a temperature sufficient to melt the doped quartz. As the peripheral portions of the doped quartz melt, they become fused together and form a gas-tight seal. Quartz fusing processes are known to those skilled in the art of quartz processing. As is discussed in greater detail with reference to FIG. 12, if the bonding is performed in a sleeve, then the concentric alignment is more easily maintained. This alignment sleeve feature can be supplemented or replaced with an array of alignment pins. Although this design is described as made of quartz and diffusion bonded, it could also be made of other material such as alumina and glass frit bonding. One of ordinary skill in the art will recognize that other insulating and bonding materials may be used without departing from the spirit of the invention.

Figure 1F:
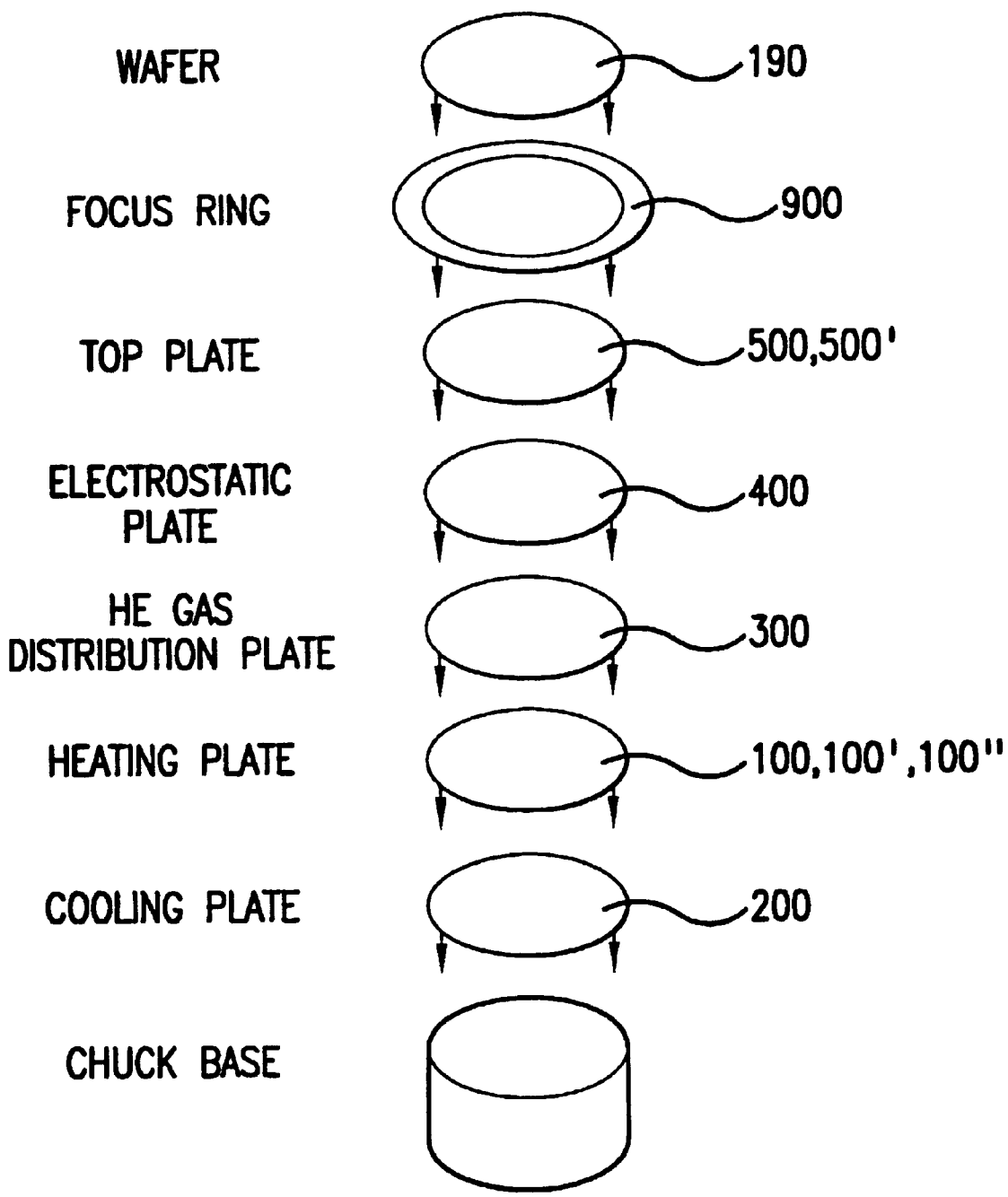
FIG. 1F is a top view of a focus ring on top of the layers of the wafer holder.
Figure 1G:
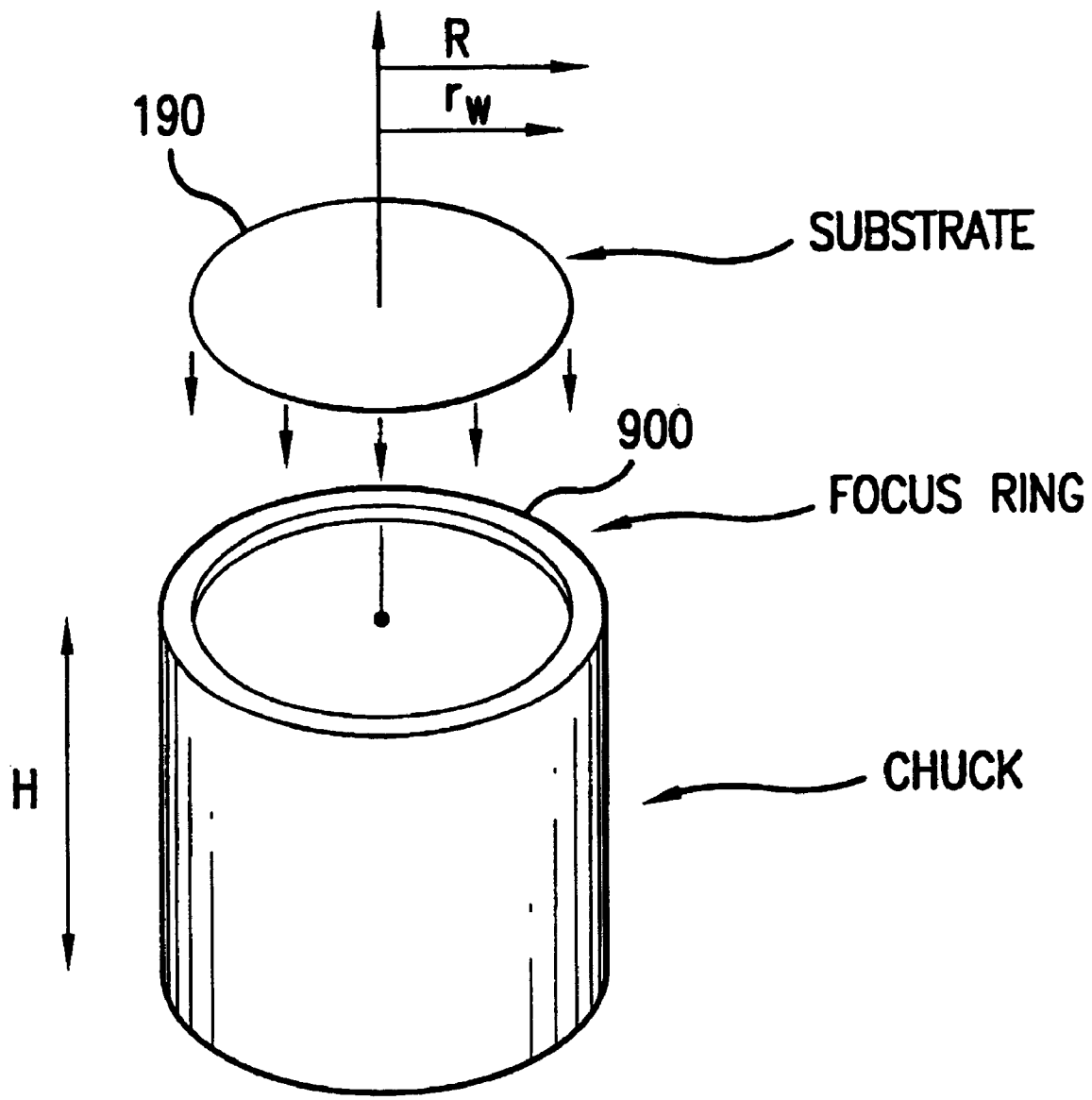
FIG. 1G is a top view of the focus ring combined with the layers of FIG. 1F.

By assembling all the plates together, a multi-purpose substrate holder is created. The structure of FIG. 1A is shown in FIG. 1F in a condensed form. In addition to the plates, a focus ring 900 is shown which consistently aligns the wafer of the chuck and affects the edge plasma over the wafer 190. Once assembled, the focus ring 900 and substrate holder of FIG. 1F form a completed structure as shown in FIG. 1G.

Figure 1H:
FIG. 1H is a cross-section showing how sections can be separately formed with individual cover and base plates for each section.
Figure 1H:
Figure 1H:
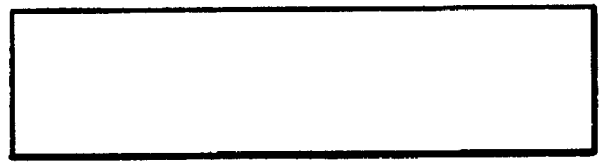
Figure 11:
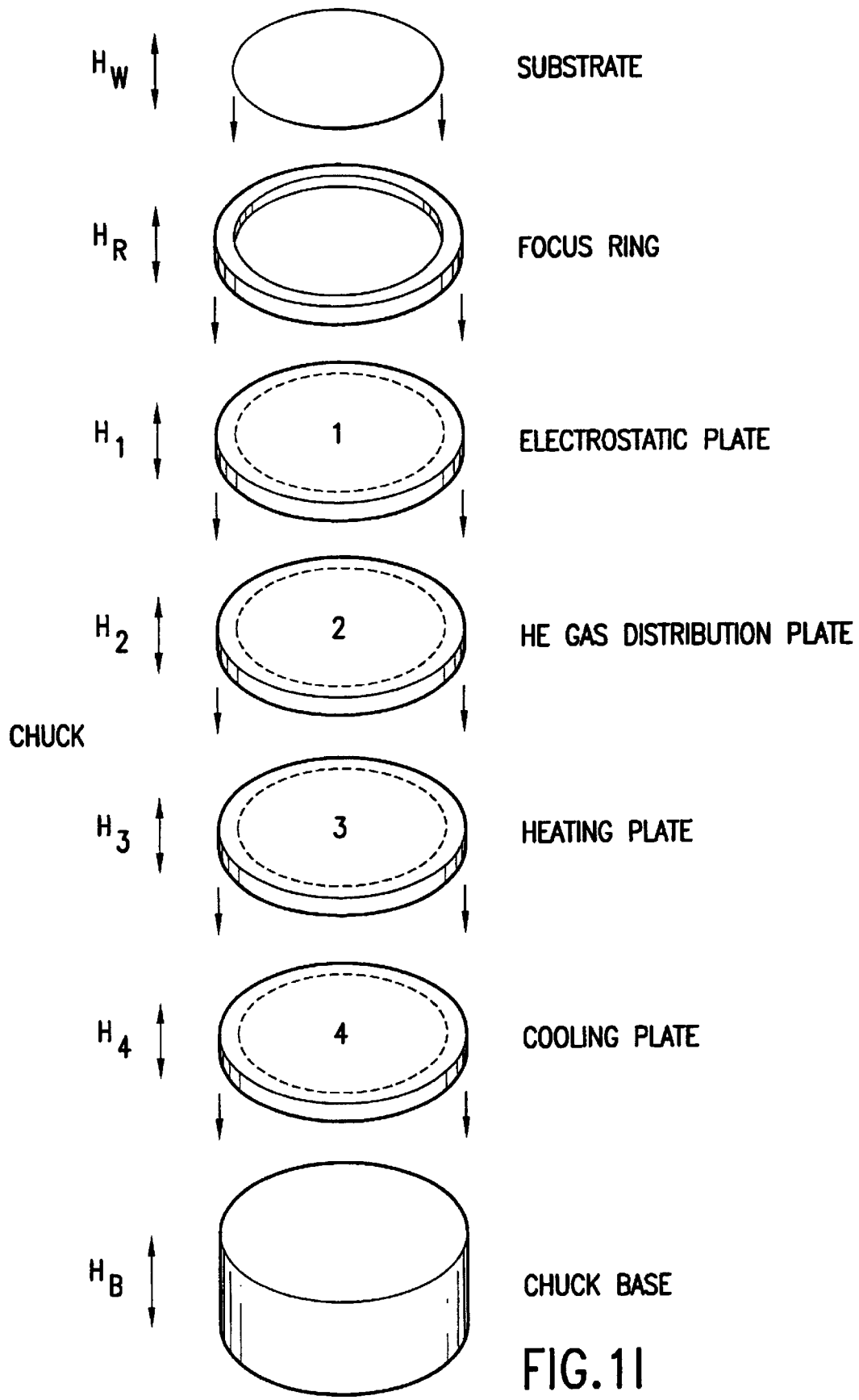
FIG. 11A is a top view of coolant strips within a multi-zone cooling section.
FIG. 11B is a cross-section of a cooling strip of the cooling strips of FIG. 11A.

In an alternative embodiment, one or more of the series of plates forming a section are formed independently and include a cover plate, a primary plate and a base plate, as shown in FIG. 1H. According to this alternative embodiment, the primary plate is formed with a series of channels or grooves to accommodate the elements (e.g., heating elements and capacitive elements) or carriers (e.g., gases or coolants) placed in the channels or grooves. The cover and base plates are utilized to keep the elements and carriers in the channels or grooves. In that embodiment, each of the sections can be used as a separate "stand-alone" component by using the cover plate, the primary plate and the base plate. That is, any one section could be attached to the electrical/fluid conduit and combined with the focus ring if the processing environment only required one function (e.g., (1) heating without cooling and clamping or (2) clamping without heating or cooling).

In general, the geometry of the substrate in semiconductor processing is circular and therefore the chuck geometry described herein will be cylindrical with the following primary dimensions shown in FIG. 1I. The geometry of the chuck, however, is not limited to a cylindrical geometry. The chuck can be described by its radius R and its height H. The height of the chuck will be a function of the components included within its design and their respective thicknesses. FIG. 1I illustrates these thicknesses as well as a preferred order of arrangement for each of the sections. The radius R of the chuck is greater than the radius of the wafer $r_w$ in order to provide space for a focus ring that allows for repeatable placement of the wafer (or substrate) upon the chuck. FIG. 1G shows the dimensions in relation to each other. The radius of the chuck can be scaled according to the size of the substrate to be processed (e.g., 8 and 12 inch diameters). Lastly, the zone pattern has a radius substantially equivalent to the radius of the substrate.

The chuck base serves as a structural base to the chuck components and can also act as a manifold wherein all electrical wiring, coolant and gas can be distributed to their respective component destinations.

Figure 2:
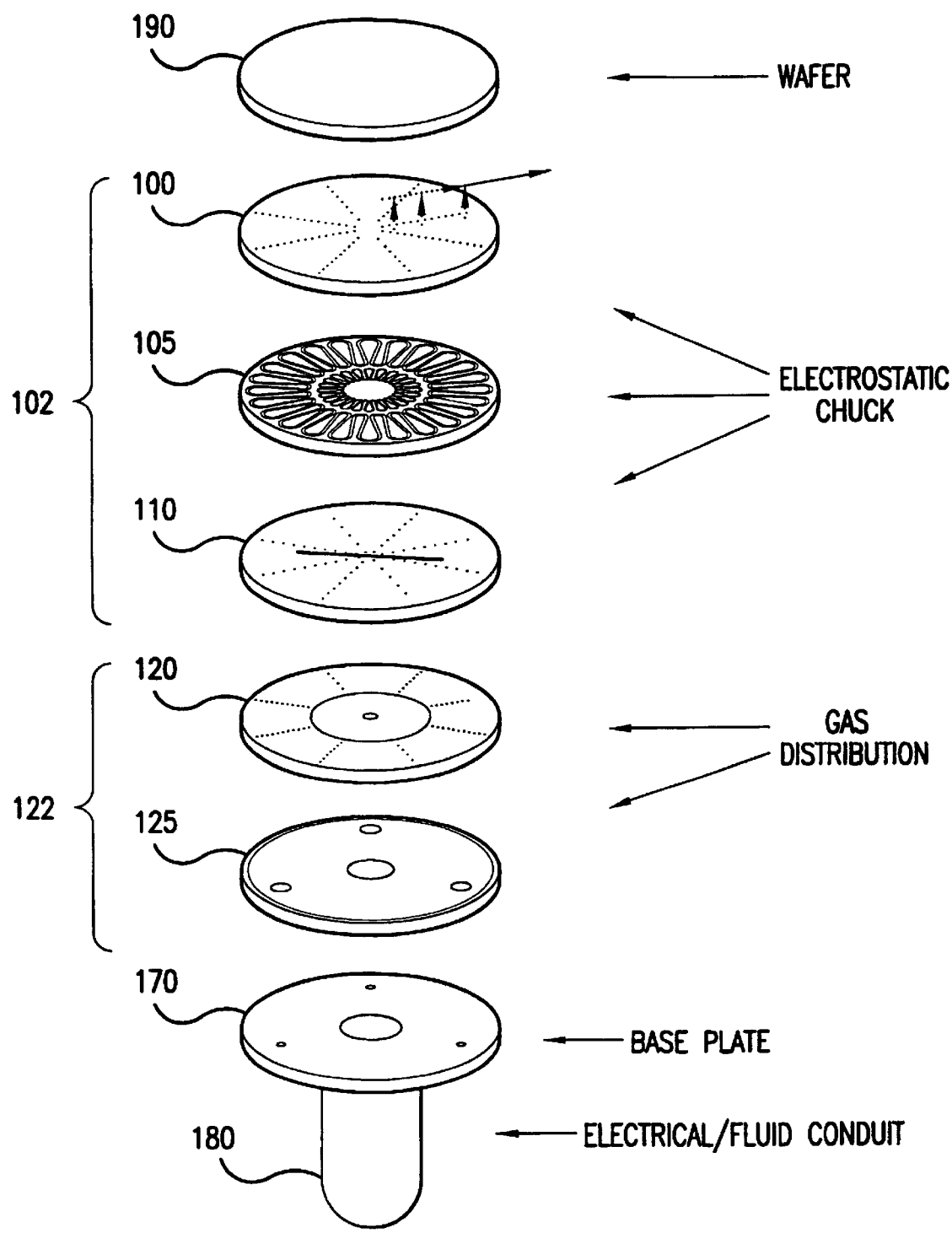
FIG. 2 is a cross-section of a cooled electrostatic chuck including an He gas distribution system underneath a multi-electrode electrostatic chuck.

In an alternate embodiment shown in FIG. 2, the wafer holder includes only a subset of the plates shown in FIG. 1A.

In this embodiment, the wafer holder only implements an electrostatic chuck and an He gas distribution system on top of the base plate. The electrical/fluid conduit accordingly only contains a subset of the conduits shown in FIGS. 1B–1D. Other assemblies are possible, such as a heater 132 with an He gas distribution system 122. In that configuration, the plate 100 becomes part of the He gas distribution system 122 and is sealed above plate 120. Moreover, the order of the assembly is dictated by the most important functions to be accomplished. For example, if cooling is more important than heating, then the order of the heating assembly 132 is switched with the cooling assembly 152 to ensure that the cooling function is closest to the substrate.

Electrostatic Chuck Section

Turning now to the layers individually, an electrostatic chuck 102 includes plates 100, 105, and 110, which act as a first, a second, and a third plate, respectively, and which are shown in FIGS. 3A–3D. The first plate 100 includes (1) lift pin through-holes 300 for enabling the wafer to be lifted off the chuck and (2) gas distribution through-holes 305 for coupling a gas to the back of a wafer 190. In alignment with these through-holes on the first plate 100 are similar through-holes 300 and 305 in the second and third plates (105 and 110). Although not shown, plate 100 may be grooved on the wafer side to further distribute the Helium gas.

As shown in FIG. 3B, also formed in the second plate 105 is two concentric channels 310 and 315 into which first and second electrostatic gripping elements (or simply "electrodes") are placed. The first and second electrostatic gripping elements provide electrostatic coupling to a wafer 190 when a wafer is present on the wafer holder. The strength of the hold of an electrostatic chuck on the wafer can be indirectly determined by measuring the capacitance between the wafer and the first and second electrostatic gripping elements when the wafer 190 is placed on the wafer holder. If the wafer 190 is not held correctly by the electrostatic chuck 102, then a warning can be signaled to the operator to reseat the wafer 190. Alternatively, the wafer 190 may be automatically reseated if an automatic wafer handling system is used. In either case, the signal may act to prevent starting a process which requires that the wafer be tightly held.

FIG. 3C shows a cross section of the second plate 105 and illustrates that the channels do not extend the entire depth of the plate 105. This allows the electrostatic gripping elements on top to be electrically isolated from the wires underneath as they pass through the conduit 180. The wires pass underneath the second plate 105 in an electrical groove 320 shown in FIG. 3D. The wires pass up from the conduit using zones 240 and 245. As would be readily apparent, the channels 310 and 315 can also be formed in the top plate 100 with the second plate being formed with a flat top.

Figure 3E:
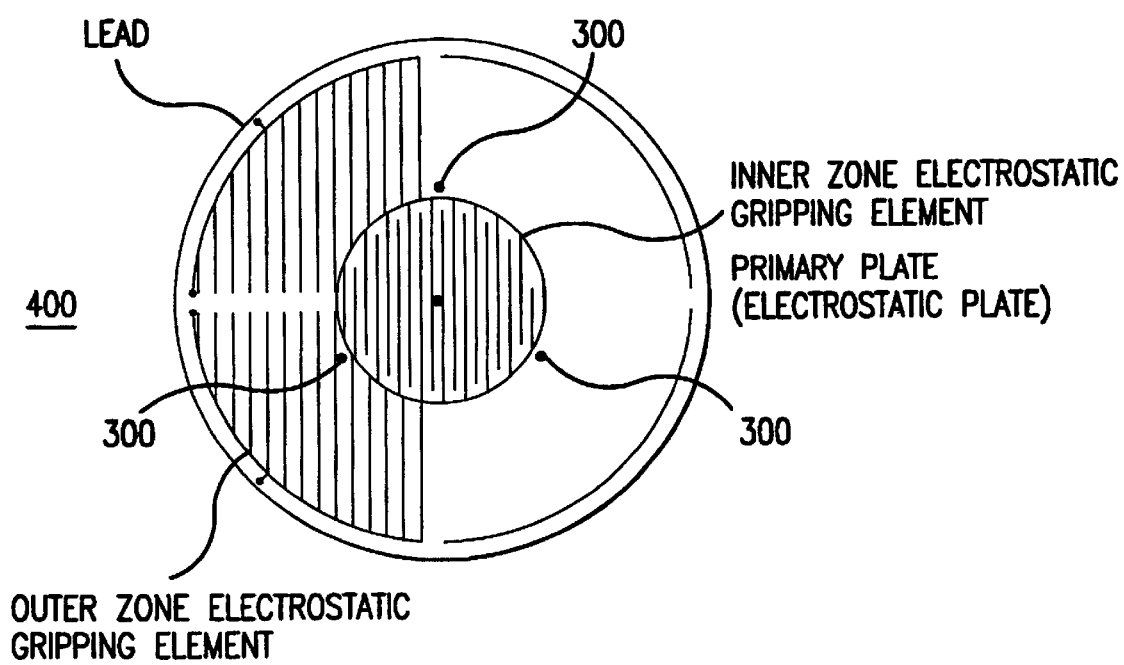
FIG. 3E is a cut-away top view of an electrostatic chuck according to a second embodiment.

FIG. 3E is a cut-away top view of an electrostatic chuck according to a second embodiment. The five zones are divided into an inner zone surrounded by four outer zones. For extra control, the inner zone likewise could be split into four sub-zones thereby forming concentric quadrants. Each electrostatic gripping element is isolated and can be maintained at its own separate voltage. The electrostatic chuck zoning may be either unipolar or bipolar (alternating sign of potential between adjacent gripping elements). In both cases, electrostatic forces are used to clamp the substrate (e.g., a wafer) to the chuck. The electrostatic gripping elements are configured for a parallel line element such that the element spires are aligned above the quartz separating the heating elements shown in FIGS. 7D and 7E. In other words, if the composite structure is viewed from above, the heating elements are visible below the electrostatic plate. Therefore, the heating elements can directly "see" the wafer and provide radiative heat transfer. Furthermore, the electrostatic gripping elements may heat up and radiate to the wafer effectively increasing the radiating area. However, this effect is believed to be small. The leads to the individual electrostatic gripping elements are shown in FIG. 3E. These may coincide with the He gas feed-throughs used for the He gas distribution plate. Exemplary lift pin holes 300 are also shown. Lastly, the primary plate thickness, H, can be thin, e.g., approximately 1 mm or 40 mil.

Moreover, although five zones are shown in FIG. 3E, it would be evident to one of ordinary skill in the art that additional zones can be formed in an alternate embodiment. The zones may either be concentric, form quadrants, form concentric quadrants, or any combination thereof. FIG. 3E shows a preferred embodiment. Likewise, if the substrate being coupled is non-circular, then the zones may be formed as a set of strips of any selected pattern required to provide uniform coupling.

The electrostatic gripping elements are seated within quartz channels. A very thick quartz plate may be used to encase the elements within the quartz. Also, as in the case of the heater element channels, clearance in the electrostatic gripping element channels is necessary to accommodate the different coefficients of thermal expansion between the gripping elements and the quartz (when heating applications are exercised, the gripping elements and surrounding quartz are likely to heat up to temperatures substantially greater than the ambient temperature).

Gas Distribution Section

Figure 4A:
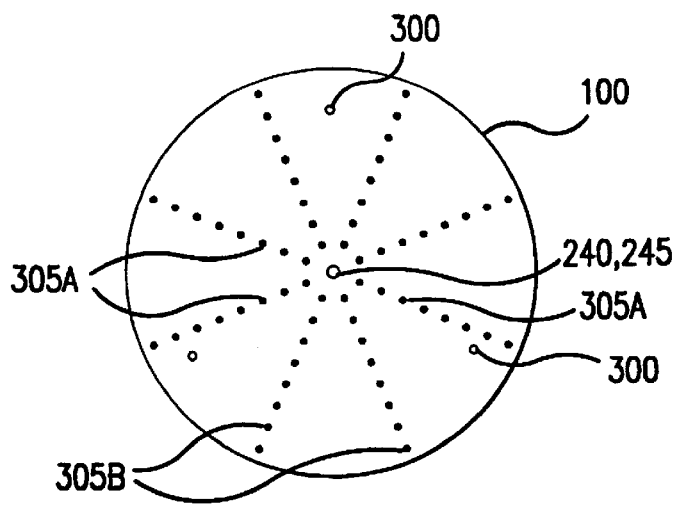
FIG. 4A is a top view of a top plate of an He gas delivery system according to a first embodiment.

In FIGS. 4A–4E, one embodiment of a gas distribution system 122 is illustrated. In one embodiment of such a gas distribution system, He gas is distributed. In alternate embodiments, other gases, preferably noble gases, are distributed. FIG. 4A shows that the top plate of the electrostatic chuck 102 is moved down into the gas distribution system 122 when the electrostatic chuck 102 is not used. When an electrostatic chuck is used, the through-holes 300 and 305 in these plates are aligned concentrically with the through-holes in the electrostatic chuck 102. Likewise, the hole 235 (e.g., a counter-bore) in the centers of those plates are used to pass gas into the plates and to allow wires to conduct to the electrostatic gripping elements in the higher plates. As illustrated, there are sixty-four holes (305A and 305B)in the top plate 100 extending radially in eight lines.

Figures 4B, 4C:
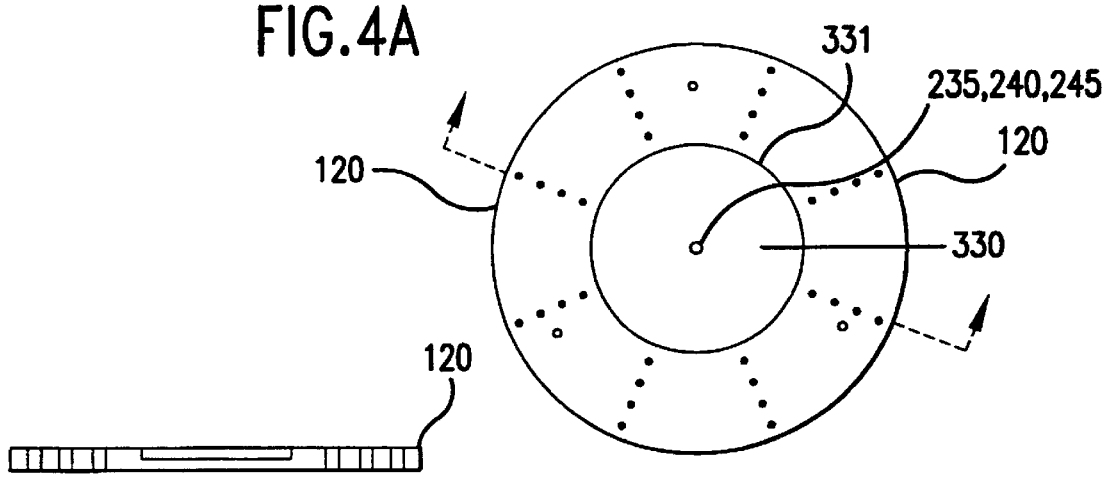
FIG. 4B is a top view of a middle plate of the He gas delivery system according to a first embodiment.
FIG. 4C is a cross section of the middle plate of the He gas delivery system according to a first embodiment.

In FIGS. 4B–4E, the separation of the gas distribution system 122 into two zones is illustrated. Gas passes through the gas-inner zone 235 and spreads into the entire gas distribution-inner zone 330 bounded by ring 331. As shown in FIG. 4C, the inner zone 330 is about half of the depth of the plate 120. The gas in zone 330 is forced out through one of the inner thirty-two through-holes 305A which are above the circle bounded by ring 331.

Figure 4D:
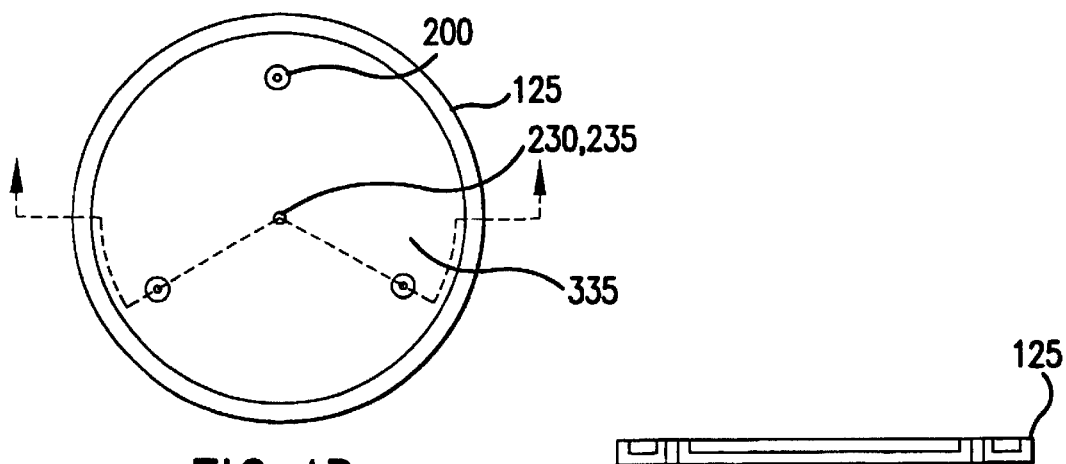
FIG. 4D is a top view of a bottom plate of the He gas delivery system according to a first embodiment.
Figure 4E:
FIG. 4E is a cross section of the bottom plate of FIG. 4D according to a first embodiment.

The second zone is supplied by a gas-outer zone 230 which fills into the gas distribution outer zone 335 shown in FIG. 4D. Like the inner zone 330 shown in FIG. 4C, the outer zone 335 is shown in FIG. 4E as being half of the depth of the plate 125. The portion of the conduit 180 that acts as the gas-outer zone 230 ends underneath the fifth plate 120, and only the gas-inner zone 235 continues above. The gas that passes to a higher layer from this layer passes via one of the thirty-two outer through-holes 305B. Thus, the flow rates (and gas types) for each zone may be modified to adjust the pressure field (and conduction) between the wafer and the wafer holder within the two radial zones. In turn, the radial distribution of the heat transfer coefficient may be varied to vary the radial distribution of the conductive-convective heat flux.

Figure 4F:
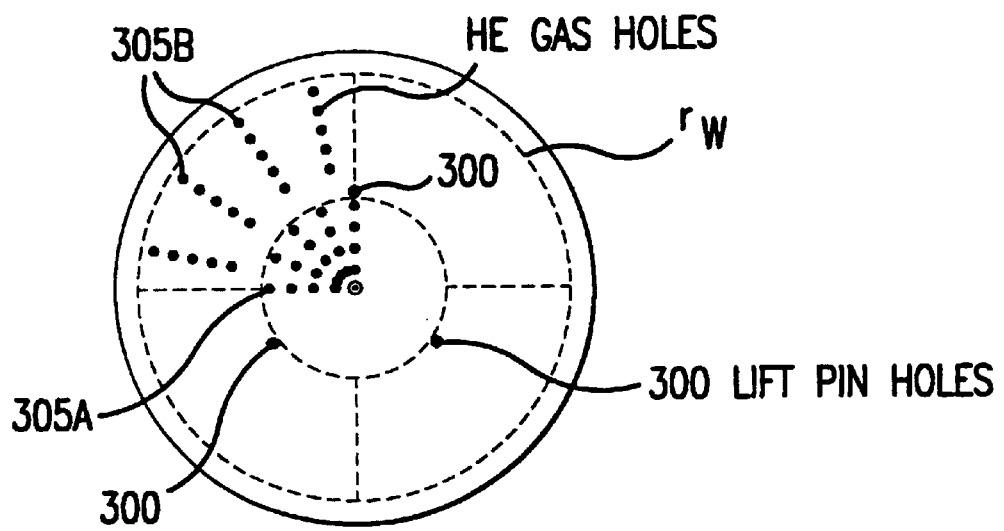
FIG. 4F is a cutaway top view of a He gas distribution system according to a second embodiment.
Figure 4G:
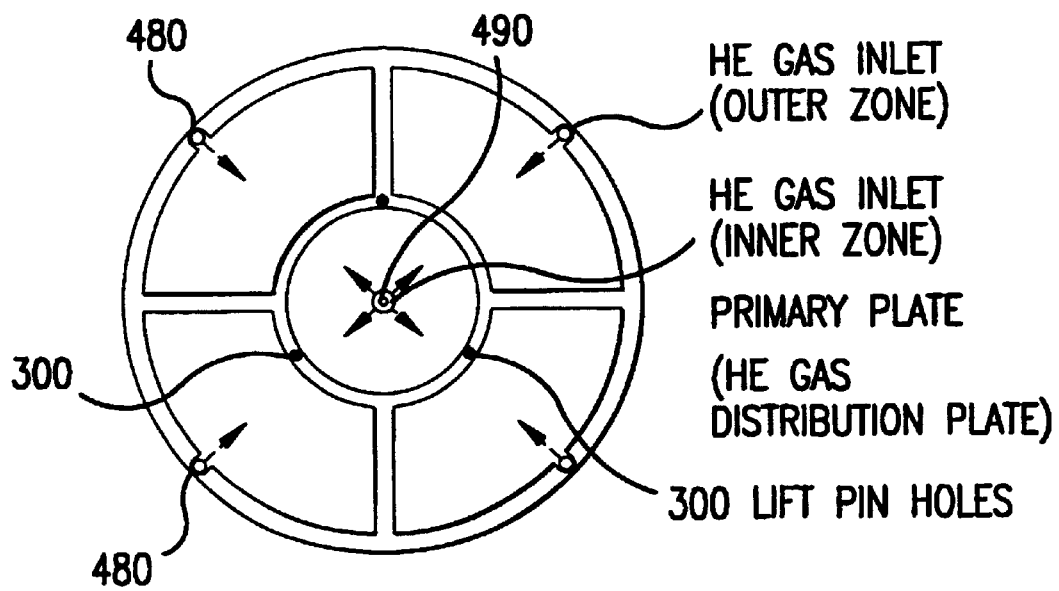
FIG. 4G is a top view of a plate of the He gas distribution system according to the second embodiment.

As discussed above with reference to the multi-zone electrostatic chuck, the multi-zone He gas distribution system (and all other elements of the present invention) can be implemented in alternate embodiments with more than two zones, in any shape or configuration appropriate to match the conduction necessary for the wafer or substrate. FIG. 4F is a cutaway top view of a He gas distribution system according to a second embodiment. FIG. 4G illustrates the primary plate for the He gas distribution component. The thickness H2 of the He gas distribution plate can be small, i.e., less than 1 mm or 40 mil total.

Figure 4H:
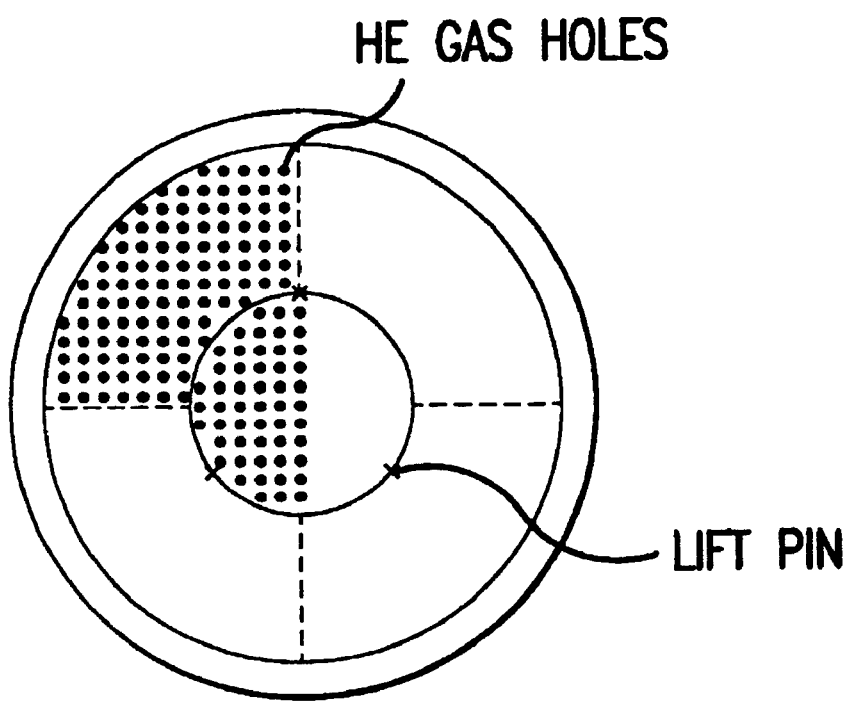
FIG. 4H is a cutaway top view of a He gas distribution system according to a third embodiment.

FIGS. 4F and 4H illustrate two different He gas shower head designs. This plate may serve as the cover plate of the chuck below the focus ring. It simply serves the purpose of passing the gas to the backside of the wafer. The embodiment of FIG. 4F utilizes a radial design, and the embodiment of FIG. 4H illustrates a preferred, parallel line design. Using the embodiment of FIG. 4H, the parallel lines of the gas holes are interweaved between electrostatic gripping elements. In general, if the electrostatic component and the He gas distribution component are used (if He gas is used, an electrostatic component or other mechanical gripping element must be used to counter the gas pressure on the backside of the wafer), then the arrangement will be as shown in FIG. 1F. This means that the hole distribution shown in FIG. 4H coincides with a hole distribution in the corresponding electrostatic plate shown in FIG. 3E (although the holes are not shown in FIG. 3E). The primary plate (of FIG. 3E) is then designed to have these holes. Hence, the holes will run parallel between adjacent electrostatic spires. The thickness $H_2'$ of the cover plate can be very small, i.e., less than 0.5 mm or 20 mil. The He gas distribution plate is placed below the electrostatic plate such that the distance between the electrostatic plate and the wafer is minimal, hence, maximizing the electrostatic coupling.

As opposed to the embodiments of FIGS. 4A–4E, the division of the zones may also be accomplished externally to the wafer holder itself. In this embodiment, the gas passing through holes 305A and 305B are fed by separate inlets 480 and 490 that extend from the top to the bottom of the wafer holder (i.e., throughout the entire wafer holder down to a manifold). Gas lines coupled to the bottom of the inlets 480 and 490 then provide gas to individual holes or groups of holes. These inlets 480 and 490 may also serve as the electrical conduits for the electrostatic gripping elements.

This approach provides the finest-grain control of conduction since each hole or group of holes can be controlled separately. This approach, however, requires the most care in the preparation of the quartz plates such that the holes 305A and 305B do not interfere with the routing of heating elements or cooling channels described below.

Resistance Heating Section

Figure 5A:
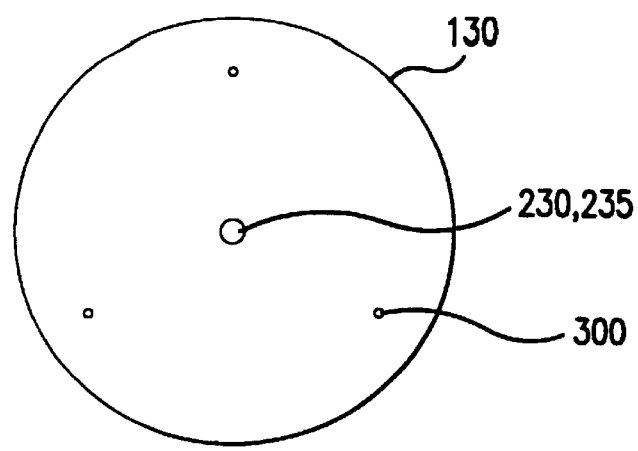
FIG. 5A is a top view of a top plate of an electrical resistance heater.
Figure 5B:
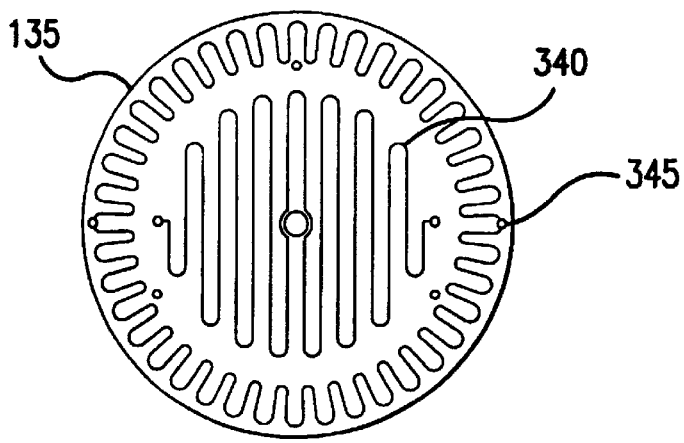
FIG. 5B is a top view of a middle plate of an electrical resistance heater having an inner zone and an outer zone according to a first implementation.
Figure 5C:
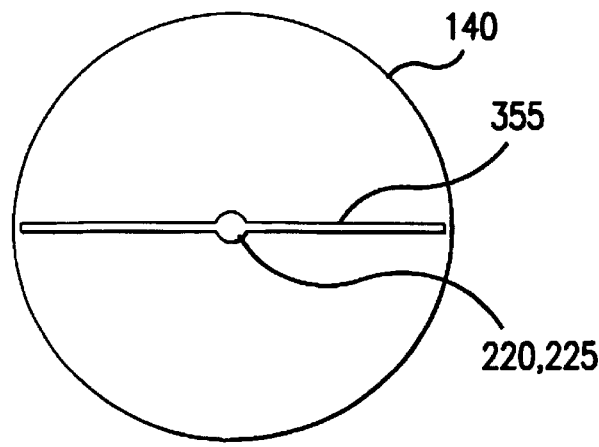
FIG. 5C is a top view of a bottom plate of an electrical resistance heater.

The resistance heater shown in FIGS. 5A–5C is designated generally by reference numeral 132 and includes a generally central resistance heater element channel 340 and a surrounding peripheral resistance heater element channel 345. As shown in FIG. 5B, central resistance heater element channel 340 has an outer periphery substantially commensurate with the inner periphery of a surrounding annular array or elements. The resistance heater elements for the channels 340 and 345 are connected to wires passing through the electrical/fluid conduit 180.

The channels are cut into (or otherwise formed in) an upper surface of the eighth quartz plate 135. Alternatively, the channels may be formed in the under surface of the seventh plate 130. The thickness of the quartz plate is selected to provide sufficient mechanical strength to resist pressure differentials between the resistance heater element and the low pressure processing area. However, the thickness is balanced by (1) a need to provide maximum heat transfer through the plates 130 and 135 and (2) a desire to have a reduced thermal mass and inertia. Such heat is primarily transferred by radiation and conduction, depending upon the temperature and material properties of the surfaces. In these configurations, with highly resistive materials it is possible to achieve a 5–25 kW heater (dependent upon the chuck diameter or wafer diameter, i.e., 5 to 12 inch wafer diameter). By using a heater with a low thermal mass, faster heating and cooling of the substrate is possible than with a heater whose thermal mass is significantly larger than the substrate. As with the electrostatic gripping elements in the electrostatic chuck, a groove 355 is supplied in the ninth plate 140 into which are placed the wires coupling the resistance heater elements in the channels 340 and 345.

As described above with reference to multi-zone electrostatic chuck and the multi-zone gas distribution system, the present invention also encompasses a multi-zone heater. FIGS. 7C through 7E illustrate alternative zoning as compared with FIG. 5B.

In general, FIG. 7E is preferred since it provides adjustment and control of properties both in the radial and azimuthal directions. In the preferred case, it consists of 5 zones, however, it may be more wherein greater radial or azimuthal resolution can be provided. For instance, it is generally desirable to have greater radial resolution at the wafer edge to compensate for edge loss. By comparison, FIG. 5B illustrates a design that adds the additional constraint that the adjustment and/or control is axisymmetric (no azimuthal adjustment). Hence, the zones consist of rings—illustratively two concentric rings. Again, the number may be increased to provide greater resolution in the radial direction. Of course, the present invention is not restricted to the zone patterning of the aforementioned designs. In fact, the patterning can be some complex formulation of surface areas so as to compensate for gross non-uniformities in the processed substrate. On such example is illustrated in FIG. 7C.

In an alternate embodiment, shown in FIG. 6B, the channels 340 and 345 of FIG. 5B are replaced by channels 340' and 345' which cover about 80% of the surface area of the wafer holder. An enlarged view of these channels is shown in FIG. 6D. Another alternative is to make the grooves by using two plates. One plate is the bottom of the groove and the second is cut completely through to be a spacer between the elements. Bonding the two plates provide the same cross section as described in FIG. 6E. These channels are significantly larger than those of FIG. 5B. The design of the element surface area is dictated by maximizing the radiative heat transfer of the heating element to the adjacent quartz plate and the silicon wafer. In this embodiment, the depth of the channels versus the distance between channels must be regulated. As shown in FIG. 6E, in one embodiment of the invention, the width of each quartz finger 361 is at least as large as a thickness of the quartz remaining after a channel is formed therein. This provides good tensile strength to withstand the internal loads due to expansion of the quartz. In both embodiments of the heater, the heat transport mechanisms for heating the wafer include: (1) conduction through the entire assembly between the heating element and the wafer, (2) radiation exchange between the heating element and the wafer, and (3) conduction between the adjacent heating element and the quartz followed by radiative exchange between the quartz and the wafer. Although additional heat transport mechanisms may exist, the three described methods are the most significant. In addition, the number of zones and their spatial distribution can be altered without departing from the spirit of the present invention.

In a preferred embodiment the resistance heater elements are serpentine; however, in an alternate embodiment, non-serpentine shapes are used, e.g., V-shapes and U-shapes with square edges as opposed to rounded edges. As shown in FIG. 6B, channels 340' and 345' extend generally parallel to adjacent trailing and leading segments thereof. For example, segment 340A extends generally parallel to adjacent segment 340B.

Figure 7A:
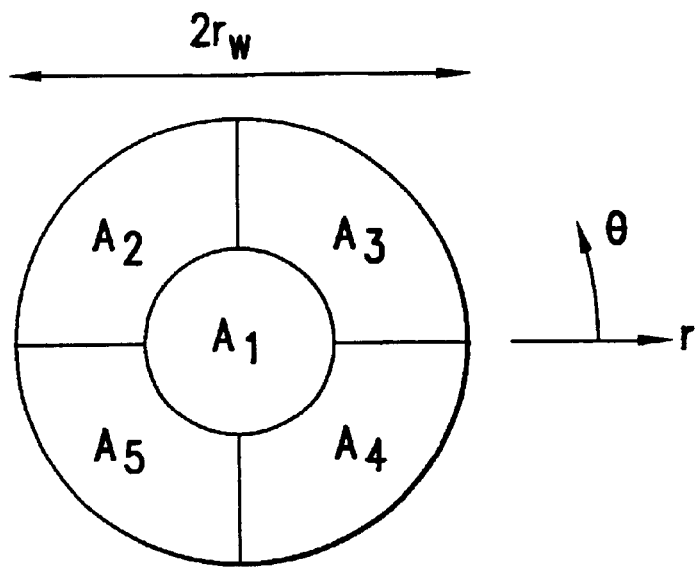
FIG. 7A is a schematic illustration of a five-part heater according to a third implementation.
Figure 7B:
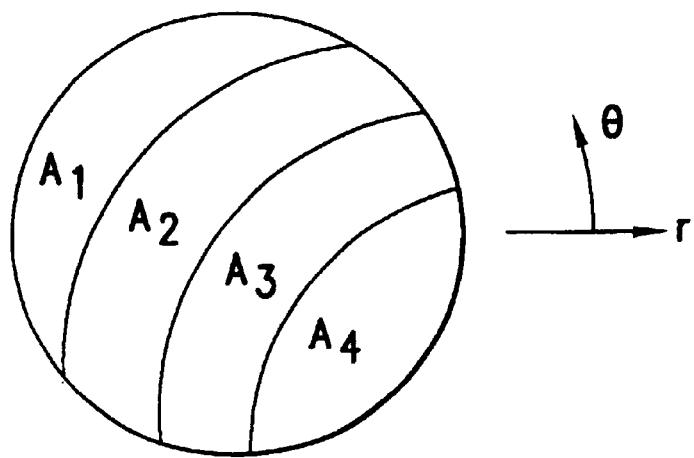
FIG. 7B is a schematic illustration of a four-part heater according to a fourth implementation.
Figure 7C:
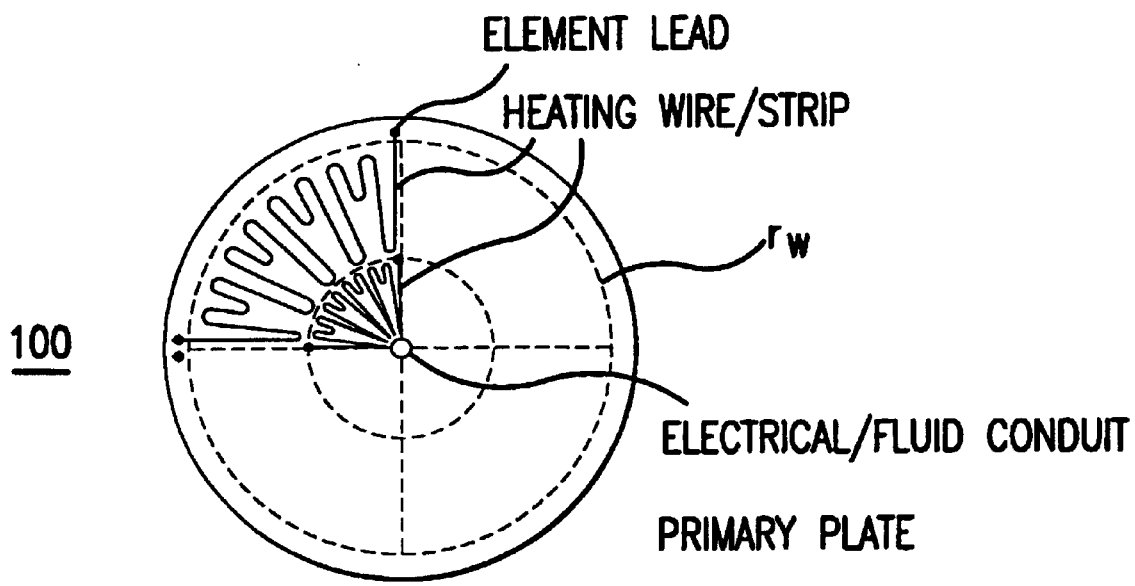
FIG. 7C is a schematic illustration of a eight-part heater according to a fifth implementation.
Figure 7D:
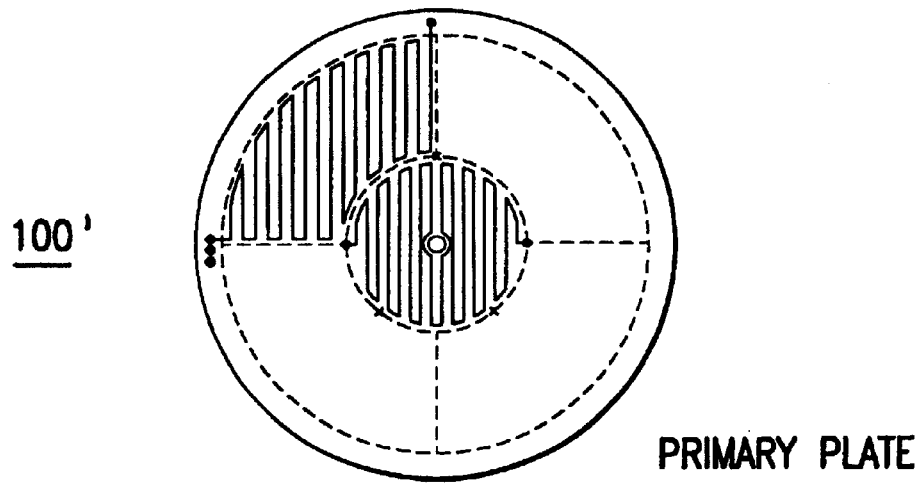
FIG. 7D is a schematic illustration of a five-part heater according to a sixth implementation.
Figure 7E:
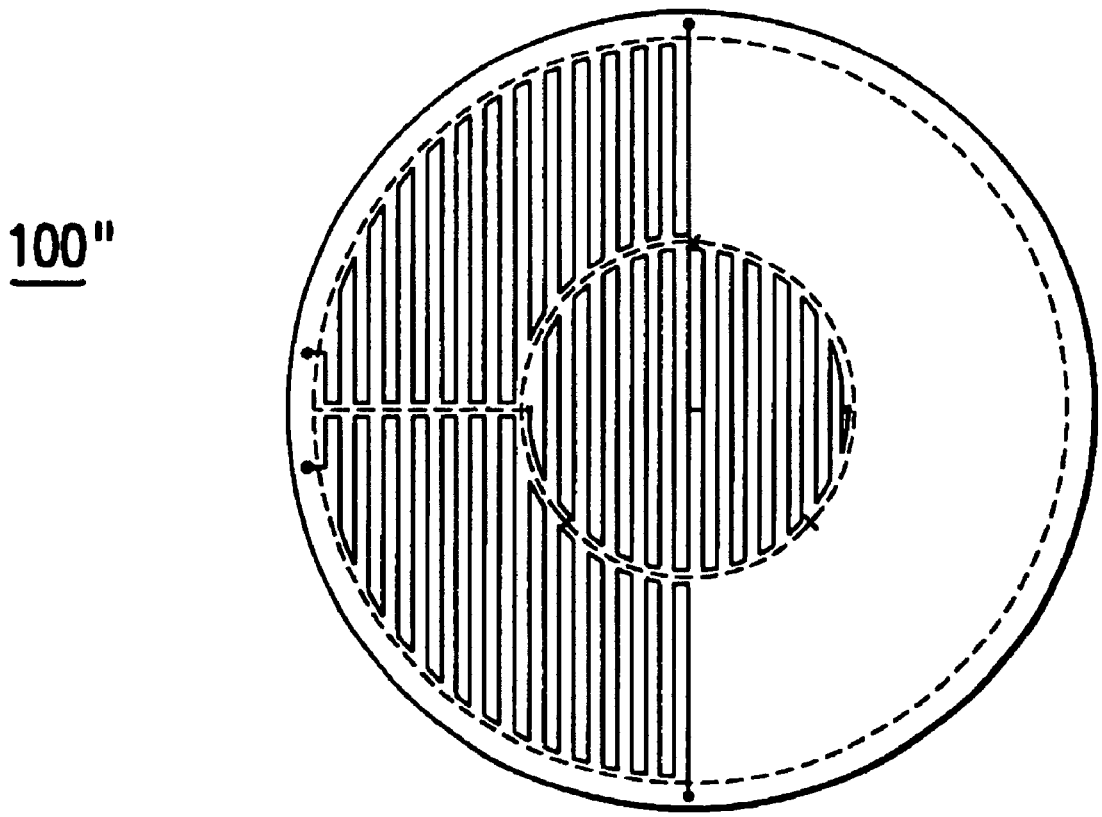
FIG. 7E is a schematic illustration of a five-part heater according to a seventh implementation.

In general, the heating section of the present invention, like any of the other sections of the substrate holder can be implemented in the five-zone configuration as shown in FIG. 7A or in a set of concentric zones as shown in FIG. 7B. The inner zone of FIG. 7A could further be divided into quadrants or quadrants with an inner zone. That is, the five zones (A1–A5) of FIG. 7A can be incorporated into a larger inner zone A1. Thus, the shape can be defined recursively down to a smallest inner zone that is either completely controlled or controlled by quadrants without a separate inner zone. Each of the widths of the quadrants in the radial direction need not be the same size.

As for the concentric zones of FIG. 7B, each of the zones need not be the same size. As the radius r increases, the width of each zone in the radial direction may vary, with larger or smaller zones near the edge as compared to near the center. This configuration has less individual control than the corresponding design of FIG. 7A when FIG. 7A is implemented to have an equal number of rings, each broken into four quadrants.

Figure 8A:
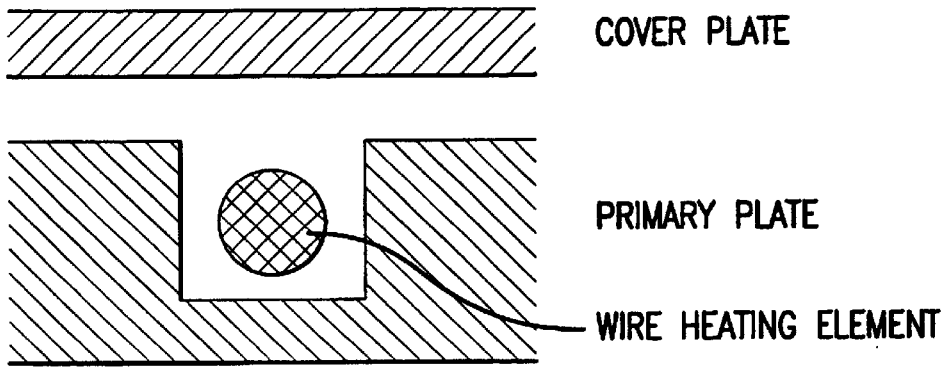
FIG. 8A is a schematic illustration of a wire heating element within a substantially square channel.
Figure 8B:
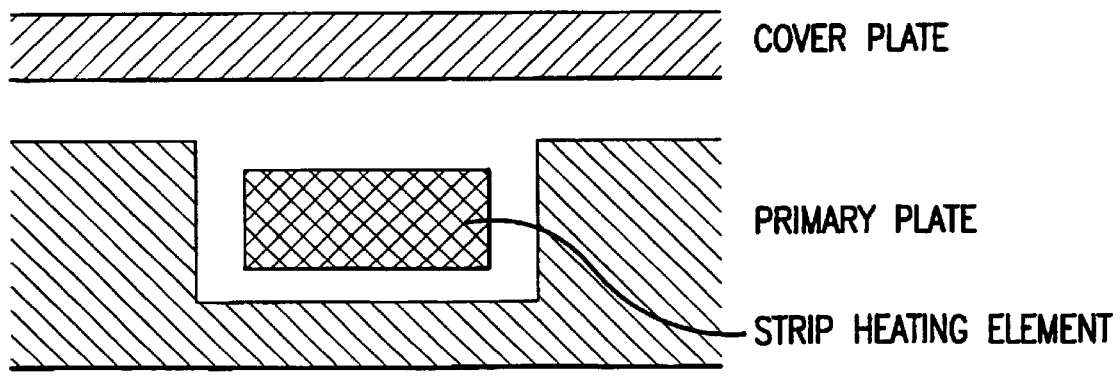
FIG. 8B is a schematic illustration of a strip heating element within a substantially rectangular channel.

Three additional designs are shown in FIGS. 7C–7E. In each of those embodiments, the heating elements are connected at an edge of the corresponding quadrant. By aligning the positions of the heating elements to not be blocked by the electrostatic gripping elements above, radiative heat is more efficiently coupled to the substrate being processed. The layout of the heating section includes layout and material considerations not only radially, but also into the plane of the heating section. FIGS. 8A–8G illustrate that the type of heating element and its corresponding channel also affect the resultant heat transfer. The heating element can be: (1) a wire in a substantially square channel (as shown in FIG. 8A), (2) a wire in a substantially circular channel (as shown in FIG. 8D), (3) a rectangular strip in a substantially rectangular channel (as shown in FIG. 8B), (4) a rectangular strip in a semicircular channel, or (5) a rectangular strip in a substantially rectangular channel having rounded corners with a relatively large radius of curvature. In an alternate embodiment (not shown), the strip is substantially square and resting in a substantially square channel of commensurate size.

Figure 8C:
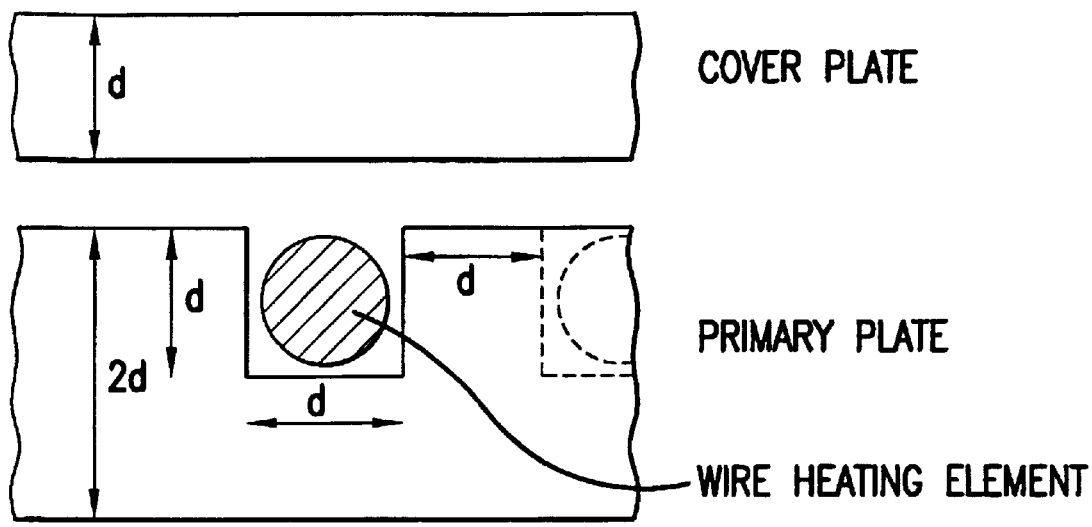
FIG. 8C is a schematic illustration of a wire heating element within a square channel with a regular pattern of quartz/channel/quartz/channel.
Figure 8D:
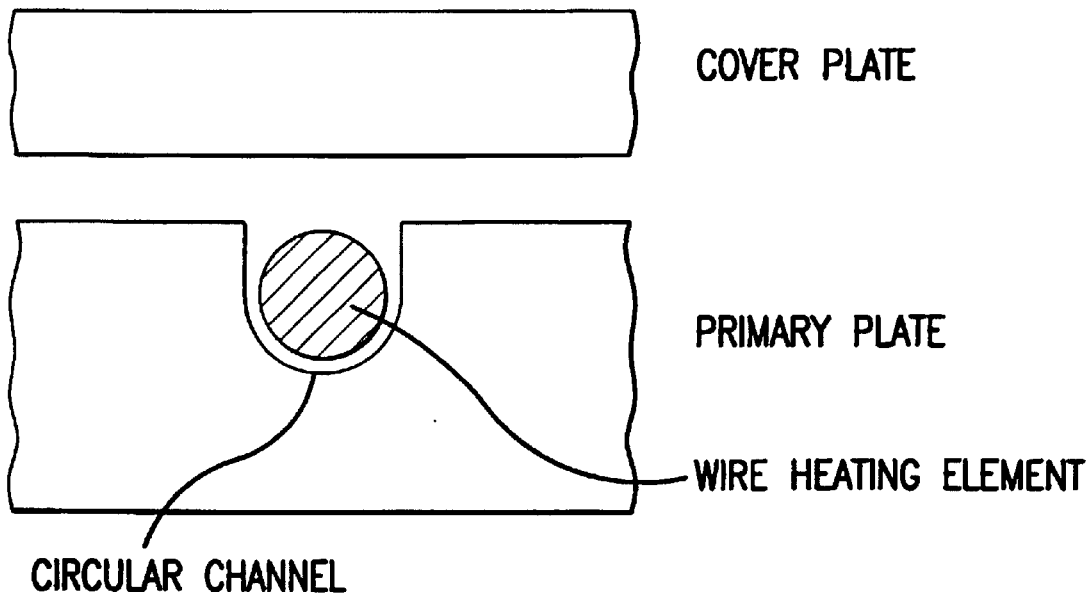
FIG. 8D is a schematic illustration of a wire heating element within a substantially circular channel.

FIG. 8C illustrates a conservative design criteria for the dimensions of the channels that are machined into the primary plate to house the heating element. The illustrated channel has a depth and width d with sufficient clearance for a heating element having a diameter of approximately d. Furthermore, the spacing between elements, the thickness of the cover plate, and the remaining thickness of the primary plate should be a distance d (hence, the primary plate has a thickness of 2d). By using the rounded bottom approach of FIG. 8D, stress concentrations are minimized that would normally occur at the corners of a square channel. Stresses within the materials comprising the primary plate arise during rapid heating wherein the stresses are generated by different rates of thermal expansion of different materials (i.e., quartz and Kanthal), and the different rates of expansion associated with temperature gradients existing within a single material. For example, a temperature gradient across the thickness of the quartz primary plate, such that the top is warmer than the bottom, would result in a greater expansion of the top surface than the bottom surface, hence, causing the plate to bow (under the resultant internal tension and compression).

FIGS. 8E and 8F present a wire and strip heating element, respectively, that have "tabs" spaced along their length. The "tabs" simply minimize the contact area between the heating element and the quartz (or other material) that houses the heating element. Since the coefficient of thermal expansion of the heating element is greater than that of quartz (by approximately a factor of twenty), the heating element may be prone to moving around. The tabs can help it stay in place wherein the bends in the housing channels, shown in FIG. 8H, can accommodate the thermal growth of the heating element. FIG. 8H represents a 180 degree bend in the heating element. If the channel is nominally 1 mm in thickness, then the thickness within the bend may be 1.5 to 2 mm to accommodate element growth. For example, a 1 m long heating element, that is heated to a temperature 1000 degrees above room temperature, can be expected to grow approximately 1 cm (this distance may be distributed equally between all of the bends).

It is also possible to make the heater element channels very large such that the elements may move around when heated and hence minimize any stresses in the heating element due to contact with the quartz encasement. Furthermore, the larger volumes to machine demand less complex machining. There are, however, some disadvantages. If the channels are simply made larger than those described above, the frontal surface area of the heating element may be sacrificed. Secondly, if a hollowed volume is used, the movement of the element may cause shorting of the element.

Figure 8G:
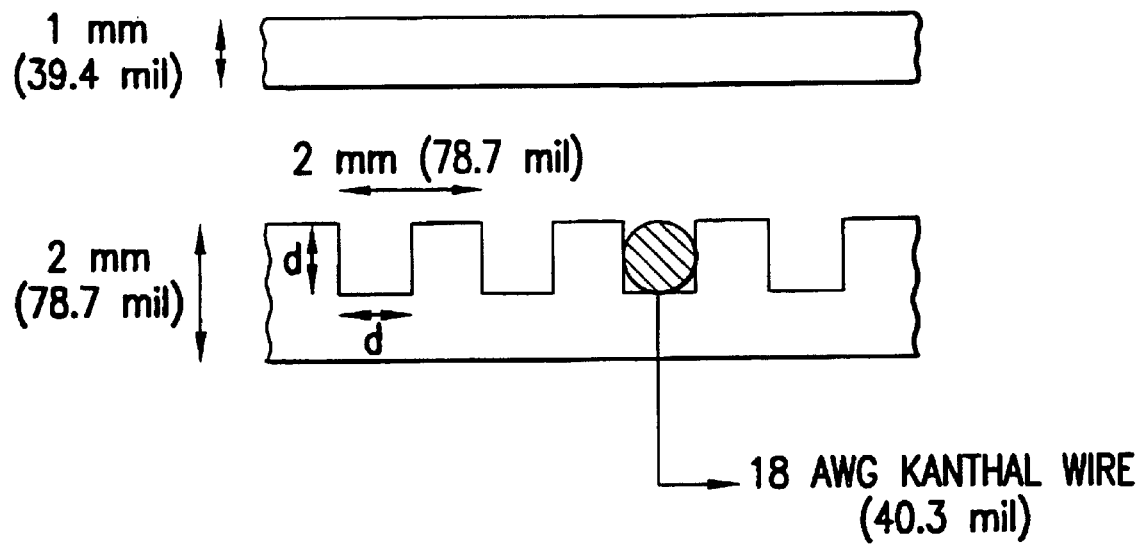
FIG. 8G is a schematic illustration of a wire heating element within a square channel with a regular pattern of quartz/channel/quartz/channel.
Figure 8H:
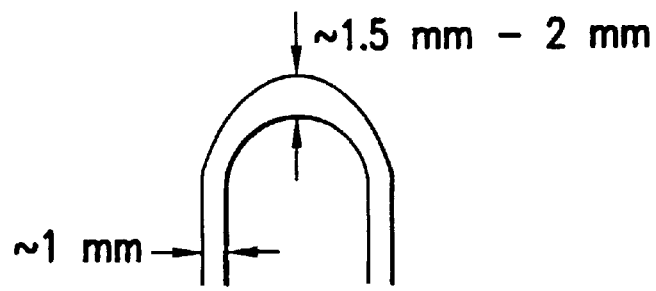
FIG. 8H is a schematic illustration of a bent, variable width wire heating element.
Figure 8I:
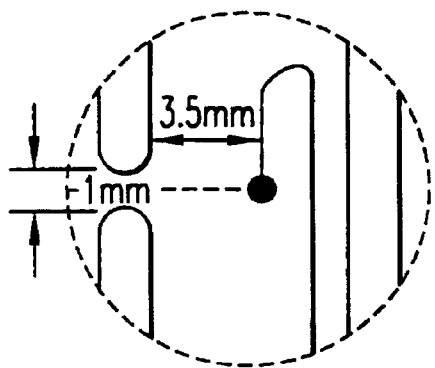
FIG. 8I is an enlargement of a section of a heater element.

FIG. 8G illustrates an example of actual dimensions for the cover plate and primary plate of a heating component. All major dimensions are approximately 1 mm (or 40 mil). Therefore, the use of this heating element in a multiple component chuck would result in a thickness $H_3$ of 2 mm (or 80 mil) as shown in FIG. 1I. FIG. 8I illustrates the intersection of three zones (in particular, the center zone and two outer zones) and provides some dimensions for the spacing of the elements in separate zones. Note, that these are conservative dimensions. They may be reduced to improve the thermal response of the plate and maintain structural integrity.

Figure 8J:
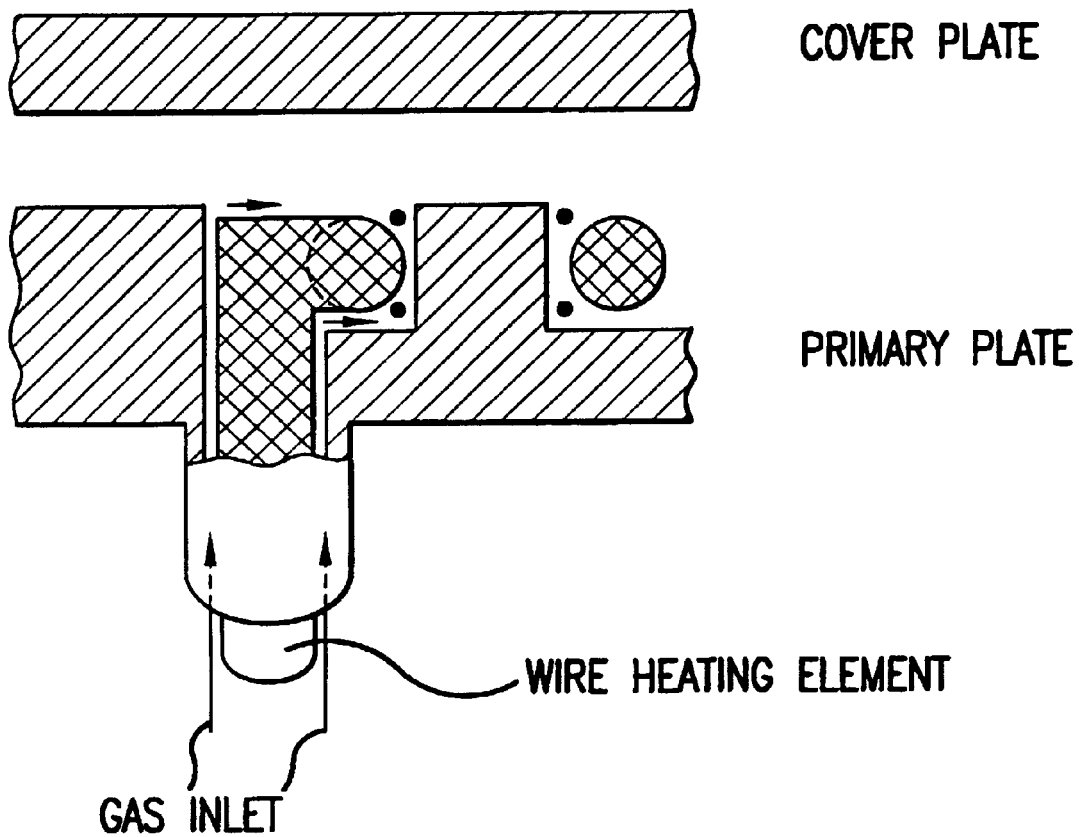
FIG. 8J is an enlargement of a wire lead attaching to a wire heater element within a channel.
Figure 9A:
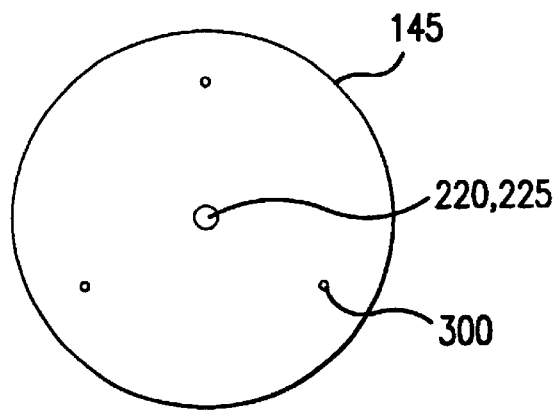
FIG. 9A is a top view of a top plate of a cooling system according to a first implementation.
Figure 9D:
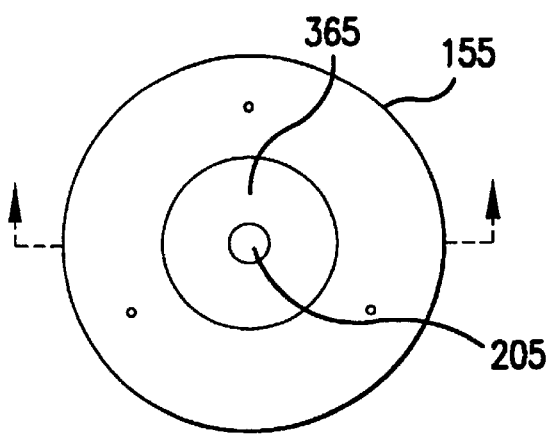
FIG. 9D is a top view of a third plate of the cooling system according to a first implementation.
Figure 9B:
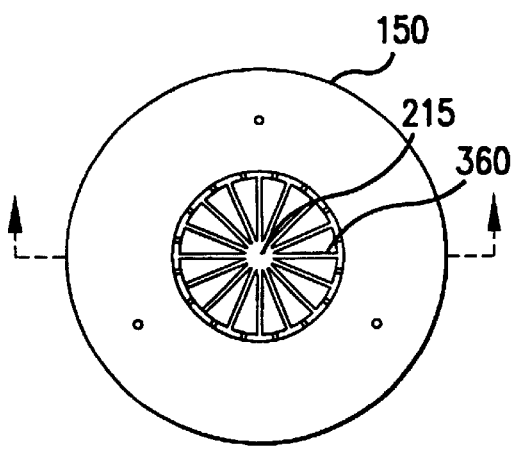
FIG. 9B is a top view of a second plate of the cooling system according to a first implementation.
Figure 9E:
FIG. 9E is a cross section of the third plate of the cooling system shown in FIG. 9D.
Figure 9C:
FIG. 9C is a cross section of the second plate of the cooling system shown in FIG. 9B.
Figure 9F:
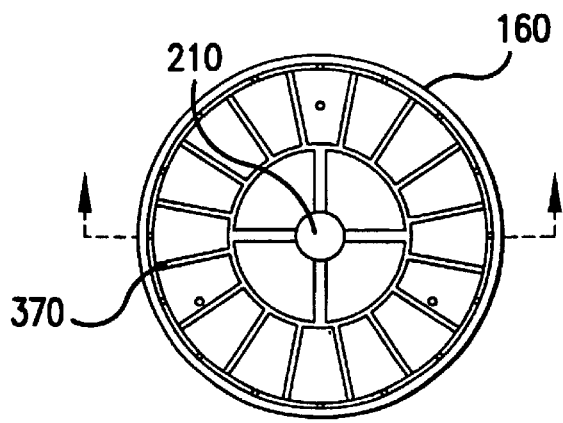
FIG. 9F is a top view of a fourth plate of the cooling system according to a first implementation.
Figure 9G:
FIG. 9G is a cross section of the fourth plate of the cooling system shown in FIG. 9F.
Figure 9H:
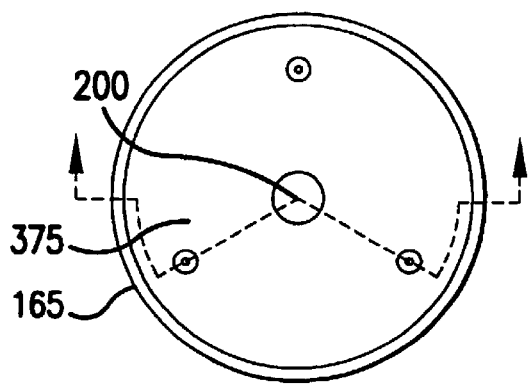
FIG. 9H is a top view of a fifth plate of the cooling system according to a first implementation.
Figure 9I:
FIG. 9I is a cross section of the fifth plate of the cooling system shown in FIG. 9H.

FIG. 8J presents a partial cross-section of the heating component including the primary plate and the cover plate. In particular, it shows an enlarged view of the point where a lead to the heating element passes from the heating component (primary plate) into the structure below. In the gap surrounding the resistive heating element, high pressure air (oxygen) can be either forced or unforced. High pressure may simply mean atmospheric pressure (which is high relative to the vacuum pressure). The passage of air (or oxygen) through the annulus surrounding the heating element can serve two purposes. Firstly, the presence of oxygen adjacent to the Kanthal surface can cause oxidation of aluminum that diffuses to the surface of a Kanthal alloy comprising iron, aluminum, chromium, carbon and cobalt. The resultant layer of aluminum oxide can protect the heating element and prolong its lifetime. Additionally, the aluminum oxide layer has good emission properties in the IR spectrum of interest. Secondly, if the air is forced through the annulus it can be used as an additional means of quickly cooling the heating element upon turning off the power to the element. Using forced convection, one can remove residual heat within the heating element, hence, improving the overall response of the cooling system. The heating element channel for each zone is its own separate closed loop both electrically and fluid mechanically. Therefore, the power and/or air flow rate may be varied between zone.

A shaped resistance heater element may be formed by a number of different methods. Laser and water jet cutting are good methods of cutting the desired heater element pattern. Preferably, a sheet of electrically resistive material is patterned into the serpentine-shape and etched (e.g., chemically or with a laser or water) to provide a resulting structure having the desired serpentine-shape. The preferred material depends on the desired temperature range of operation, the conditions under which the element must operate, and the sheet size and thickness of the substrate to be heated. Platinum can be used in non-oxidizing environments while nichrome can be used in oxidizing environments. Nickel is useful in low temperature environments, and plated molybdenum is also effective when it is not cost-prohibitive. While several Kanthal alloys are available, the preferred Kanthal alloy is comprised of aluminum, chromium, cobalt, and iron. Such material is resistive to degradation at high temperatures provided that a protective layer of aluminum oxide is maintained over the surface thereof. To facilitate the formation and preservation of such protective oxide layer, a gas duct is used to admit oxygen into the chamber formed between the seventh and eighth plates 130 and 135, irrespective of the pressure and gas content surrounding the wafer holder.

If different gases are to surround the heater elements in the first and second channels (340' and 345'), or if two different flow rates are required for the two elements, then two gas ducts are provided to allow this functionality. Gas is then applied separately based on the characteristics of the corresponding zone. The two zones are separated by fusing ring 343 to an underside of the seventh plate 130 and providing a gas duct in each ring. According to yet another embodiment of the present invention (not shown), the seventh plate 130 is split into a circle and a concentric ring. The outer edge of the circle is fused to the inner edge of ring 343, and the concentric ring is fused to (1) an outside of ring 343 at an interior edge and (2) an inside of plate 135 at an exterior edge. Thus, the circle and the concentric ring are bonded laterally instead of vertically.

Cooling Section

In addition to heating a wafer, the present invention also provides for cooling a wafer quickly using a cooling system 152. Plates 145, 150, 155, 160, and 165 are combined into a cooling system which distributes coolant into an interior zone and an exterior zone through coolant inlets 215 and 210, respectively. The coolant for the inner zone is moved from the inlet 215 to a corresponding outlet 205 through coolant channel 360. Likewise, the coolant for the outer zone is moved from the inlet 210 to a corresponding outlet 200 through coolant channel 370. In this embodiment the inlet and outlet coolant conduits have been placed concentrically at the center of the wafer holder.

In an alternate embodiment, the plates 150, 155, 160, and 165 can be replaced by two plates 162 and 167 shown in FIGS. 10B and 10C. As shown in FIG. 10B, coolant from the inner inlet 215 passes through inner zone cooling channels 360 and into inner zone exit ring 380. The coolant is then forced down through holes 214 and expelled out the outlet zone 205 (shown in FIG. 1E). As shown in FIGS. 8D and 8E, using an outer zone inlet 430 and an outer zone outlet 420 which are not part of the conduit 180, coolant for the outer zone arrives through inlet 430 (in FIG. 10E) and passes upward through the holes 211 (shown in FIG. 10D). The coolant then passes through channels 213 and is forced back down through holes 212. The coolant is then collected in the ring 440 below (shown in FIG. 10E) and exits via outlet 420. Using this configuration, the inner and outer cooling zones are placed in the same plane for more uniform cooling efficiency. Plates 400 and 410 are thermal insulating materials that have a reflective material for the spectra of radiation of the elements. Those materials help to prevent thermal conduction into the conduit 180. As shown in FIG. 10E, the coolant inlets 430 and outlets 420 for the outer zone are directly coupled to a cooling manifold below the cooling assembly 152 rather than passing through the conduit 180.

The cooling in each zone can be separately adjusted by independently varying the coolant type and the coolant flow rate. The coolant flow rate is directly related to the heat transfer coefficient. However, while varying the coolant flow rate, one changes the pressure drop through the cooling line. Therefore, if one wished to increase the cooling, one could increase the flow rate, however, you would suffer a greater pressure drop. In a turbulent internal flow, the heat transfer coefficient is dependent upon the thermal conductivity, density, specific heat (constant pressure), velocity, viscosity, and (weakly) the hydraulic diameter of the flow duct. For a given coolant, there is only the velocity and the hydraulic diameter (where the velocity gives you the greatest return since it is almost a one-to-one linear relationship). Secondly, the pressure drop through the line is dependent upon the density, the friction factor (function of the Reynolds number), duct length, hydraulic diameter, and velocity (in fact, it is proportional to the velocity squared). The current system has been designed to obtain a good cooling rate ($h \sim 3600$ $W/m^2$-$K$) with a reasonable pressure drop ($\Delta p \sim 20$ Psi). Additionally, this design has short duct lengths to minimize the $\Delta T$ associated with heating along the length of the line (i.e., $Q=mc_p\Delta T$).

Figure 11A:
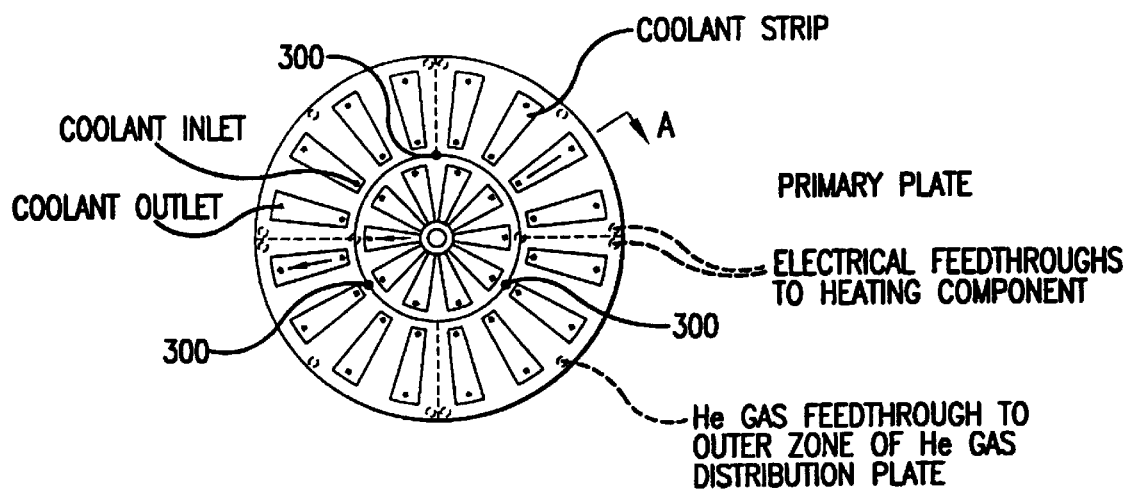
Figure 11B:
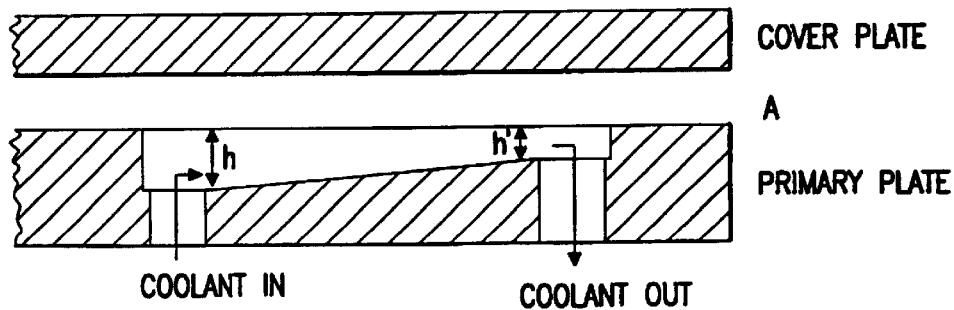

A second embodiment of the cooling section is illustrated in FIGS. 11A and 11B. FIG. 11A presents the primary plate for a multi-zone cooling component. For outer zones, coolant fluid flows radially outward from inlet holes to outlet holes as shown. Similarly, coolant fluid is fed to the inner zone radial spindles from a center annular conduit. The coolant inlets and outlets are connected with appropriate distribution and reception channels within the chuck base. The flow path for a specific zones is a closed loop that is externally connected with a coolant reservoir, heat exchanger and pump that is employed to circulate coolant through the cooling ducts. This way, the coolant temperature, coolant type and flow rate may be varied between zone to produce the desired spatial cooling characteristics. Also indicated in FIG. 11A are the feed-through holes for the electrical leads to the heating component, the gas/electrical conduits to the He gas distribution plate and electrostatic plate, and the lift pin holes 300.

FIG. 11B presents a cross-section of an outer zone radial spindle, indicated by the letter A in FIG. 11A. The respective coolant inlet and outlet are shown wherein the channel depth at the inlet might be h and the channel depth at the outlet might be h'. Since the width of the radial spindle increases as one moves radially outward (shown in FIG. 11A), the channel depth may be decreased from h to h' in order to maintain the same channel cross-sectional area. By mass conservation, the constant area maintains a constant flow velocity. If the depth is maintained constant, then the increase in area would result in a decrease of the flow velocity, hence, leading to a decrease in the heat transfer coefficient. However, by reducing the depth to maintain a constant flow velocity, only a minor penalty is paid in the slight reduction of the wetted perimeter of the channel at the outlet. This is contrasted with what would be a significant reduction in the heat flux associated with the reduction in the flow velocity. This phenomenon can be observed by inspecting the relation for the heat transfer rate for a radial section $\Delta r$, namely $Q=hA\Delta T$ (where h is the heat transfer coefficient, A is the wetted surface area, and $\Delta T$ is the temperature difference between the fluid and the material surface). The wetted surface area A is simply the wetted perimeter multiplied by $\Delta r$. Now, we compare the case of a constant cross-sectional area with the case where the cross-sectional area increases by a factor of two. In the latter case, the flow velocity decreases by a factor of two, the heat transfer coefficient decreases by a factor of two and the wetted perimeter increases by approximately 20%. Consequently, for a given $\Delta r$ and $\Delta T$, the heat flux decreases by a factor of two, and the heat transfer rate for a radial section decreases by nearly a factor of two. Preferably, the coolant flow channels are maintained throughout with an approximately constant cross-sectional area. For example, the sum of the cross-sectional areas of the inlets, the sum of the cross-sectional areas for the cooling channels and the sum of the cross-sectional areas of the outlets are approximately equivalent. This enables a constant, nearly uniform flow throughout.

A second order effect in this case is the slight reduction in the hydraulic diameter with radius which also increases the heat transfer coefficient (only slightly). These two effects are necessary to aid in achieving a constant heat flux with radius (an increase in the heat transfer coefficient can balance the increase in the coolant temperature).

An alternate embodiment includes a decreasing cross-sectional area of the channel with increasing radius. This produces an increase in the heat flux (relative to the constant area case) as one moves out radially. The heat transfer coefficient increases due to the increase in the flow velocity. For example, a reduction in the area of a factor of two (i.e., reducing the depth h by a factor of two to $h'=h/2$), can produce nearly a two-fold increase in the heat transfer coefficient at the outlet. There is, however, an increasing pressure drop with the increase in resistance. The cooling channels may be designed to produce a variety of cooling effects (in particular radial variation).

Lastly, the thickness $H_4$ of the primary plate for the cooling component will generally be greater than other components. The cooling channels can be as large as 4 mm thick and 1 cm wide. This would lead to a conservative thickness $H_4$ for the primary plate of 1 cm.

Heat Transfer Analysis

Although resistance heater elements and cooling sections of particular shapes and configurations have been described, the actual shape of heater sections and cooling sections is determined so as to match the thermal characteristics of the substrate to be heated or cooled. According to a preferred first embodiment of the present invention, a substrate of the shape and thickness to be processed is uniformly heated in an oven up to the operating temperature at which the substrate will be heated on the chuck. The heated wafer is then placed on the chuck and a piece of liquid crystal display (LCD) paper is applied to the heated wafer, since the color of the LCD paper changes with temperature. Photographs are taken of the LCD paper as it cools, and the color of the LCD paper is thus observed/recorded to observe/record temperature changes. The photographs of the cooling process show the inverse of how the substrate will need heat applied. That is, in rapid heat loss areas, extra heat will need to be applied to maintain the substrate at a uniform temperature compared to the rest of the substrate. Accordingly, the heater element is shaped so that additional coils are placed underneath the rapidly cooling areas of the substrate.

In a second embodiment of the heat analysis method, the same heat analysis can be performed using an infrared detector to detect changes in the temperature of the substrate as it cools. The sampled heat values can be displayed on a computer to show how heat is dissipated from the substrate as it cools. This method has the advantage of measuring a substrate that has a more accurate thermal conduction and radiation since it is the actual substrate. In addition, this substrate and measurement can operate at higher temperatures than expected in actual processing. Thirdly, this method can be operated in the actual gas environment of the process.

In the third embodiment of the heat analysis method, a computer is utilized to simulate the heat transfer characteristic based on a computerized model of the substrate and the chuck on which the substrate will be heated. The computer simulation can factor in a thickness of a substrate, a thickness of the quartz, and expected ambient temperatures of the processing chamber. The best method is to compare computer simulations to infrared measurements and improve the errors in the computer simulations until it is truly predictive.

Manufacturing Considerations

There are two primary steps to the manufacturing of a chuck component (and ultimately the chuck). These two components may be described as (i) machining individual plates, and (ii) adhering (or fusing together) adjacent plates. The preferred embodiment describes the building of a chuck using quartz (of course if this chuck is to be used in certain etch environments, different material(s) will be required). One environment in which a quartz chuck can be used is in an ash or strip chamber wherein the process is such that the photoresist is removed (or stripped) from the substrate.

Figure 12:
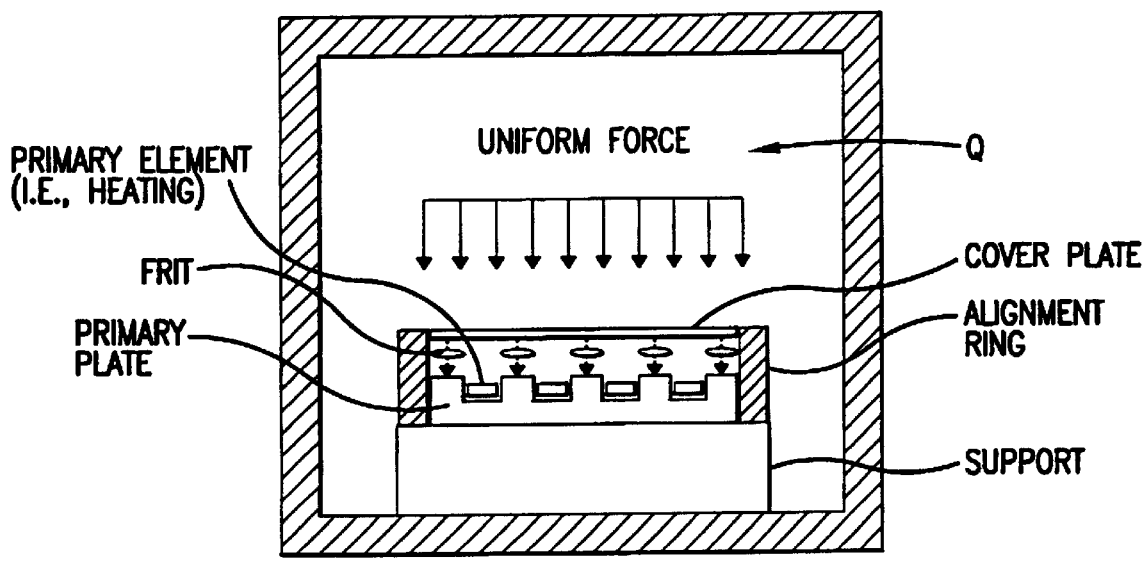
FIG. 12 is a schematic illustration of an oven for forming the substrate holder from the individual plates or separate sections.

The step of machining can consist of several substeps. It may include cutting grooves or channels, drilling holes, or simply cutting the general shape of the plate. Upon cutting the shape of the plate, machining holes, grooves or channels can be performed by any one or combination of the following: (i) water or laser cutting, (ii) using diamond grinding bits, and (iii) chemically etching. For example, one can mask (with photoresist) a pattern and etch the channels. The step of fusing plates together can be performed as shown in FIG. 12. FIG. 12 presents an oven wherein a heat input Q is applied. The plates to be fused together are set on an oven support that includes a cylindrical alignment ring used to align adjacent plates. In the case of the manufacturing of a heating plate, the primary plate is set down first, the heating element is inserted, the frit is applied to the surfaces intended to be fused, and the cover plate (or adjacent plate) is placed above. These two plates, as indicated in FIG. 12, are then loaded with a uniform force distributed across the upper surface. Of course, several plates may be fused at one time. In fact, the entire chuck can be manufactured at one time. The frit that is used to adhere adjacent plates is primarily comprised of fine quartz powder mixed within an adhesive (to ease application). The oven is heated to and soaked at a temperature of 1050° C. for approximately 1 hour, and then cooled. Upon fusing the adjacent plates, they may be removed and tested for leak integrity. Illustrative methods of manufacturing are illustrated in FIGS. 16A through 16D.

Figure 16A:
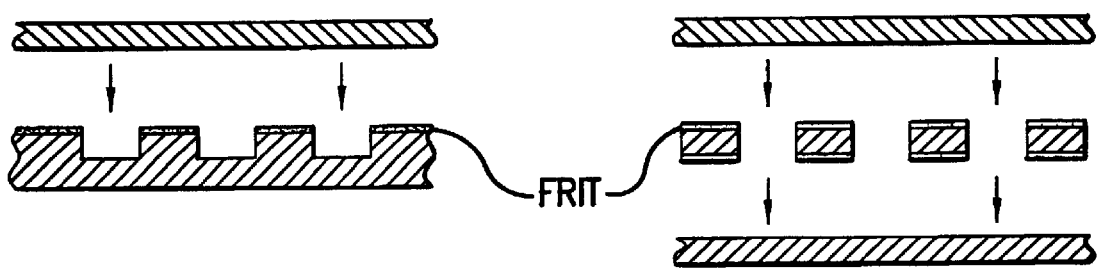
Figure 16D:
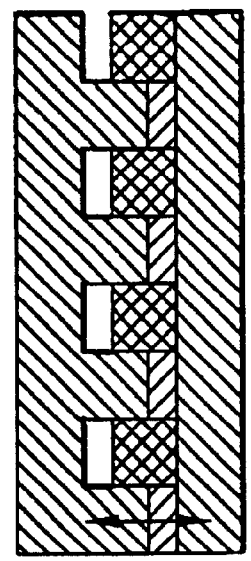
Figure 16D:
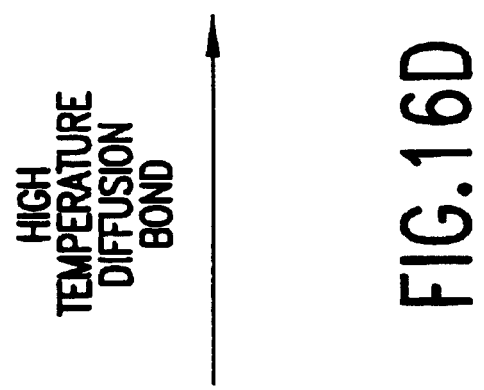
Figure 16D:
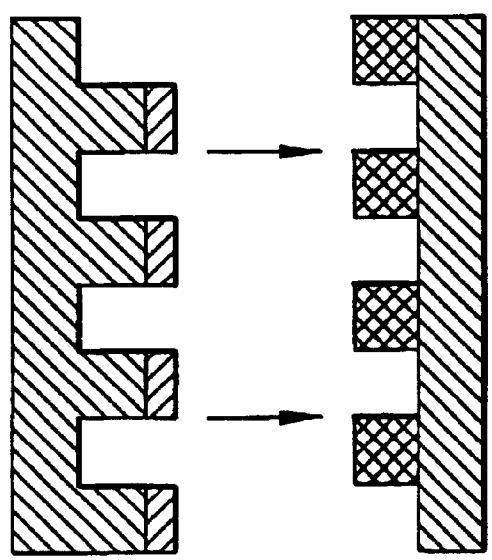

The electrodes to serve as the electro-static chuck or the heater elements can be fabricated by patterned deposition, or blanket deposition and patterned etch back. Moreover, the quartz pieces may be fabricated using either patterned deposition of photo-resist upon blanket deposition (CVD) of doped quartz upon quartz and etching, or patterned deposition (CVD) of doped quartz upon quartz and patterned etch back. Using either procedure, one may fabricate the heater element channels or gas feed-throughs, etc. The advantage to using etch and deposition techniques to fabricate such components is the ability to generate micro-features (i.e., channels), elements and very thin components (i.e., a heater plate). In doing so, one may fabricate a heater plate with a thermal inertia close to that of a wafer. FIGS. 16B, 16C and 16D provide a pictorial description of such a fabrication technique. FIG. 16B presents two alternatives to fabricate the heater elements set atop a thin quartz plate. FIG. 16C presents one method of fabricating the plate counterpart with channels in the quartz and doped quartz at the bonding surfaces. Lastly, FIG. 16D presents the final step of diffusion bonding two pieces. The features may alternatively have rounded surfaces from the etching and deposition of materials. In summary, using such techniques can enable sub-millimeter (or smaller) features.

Heat Transfer

Figure 13:
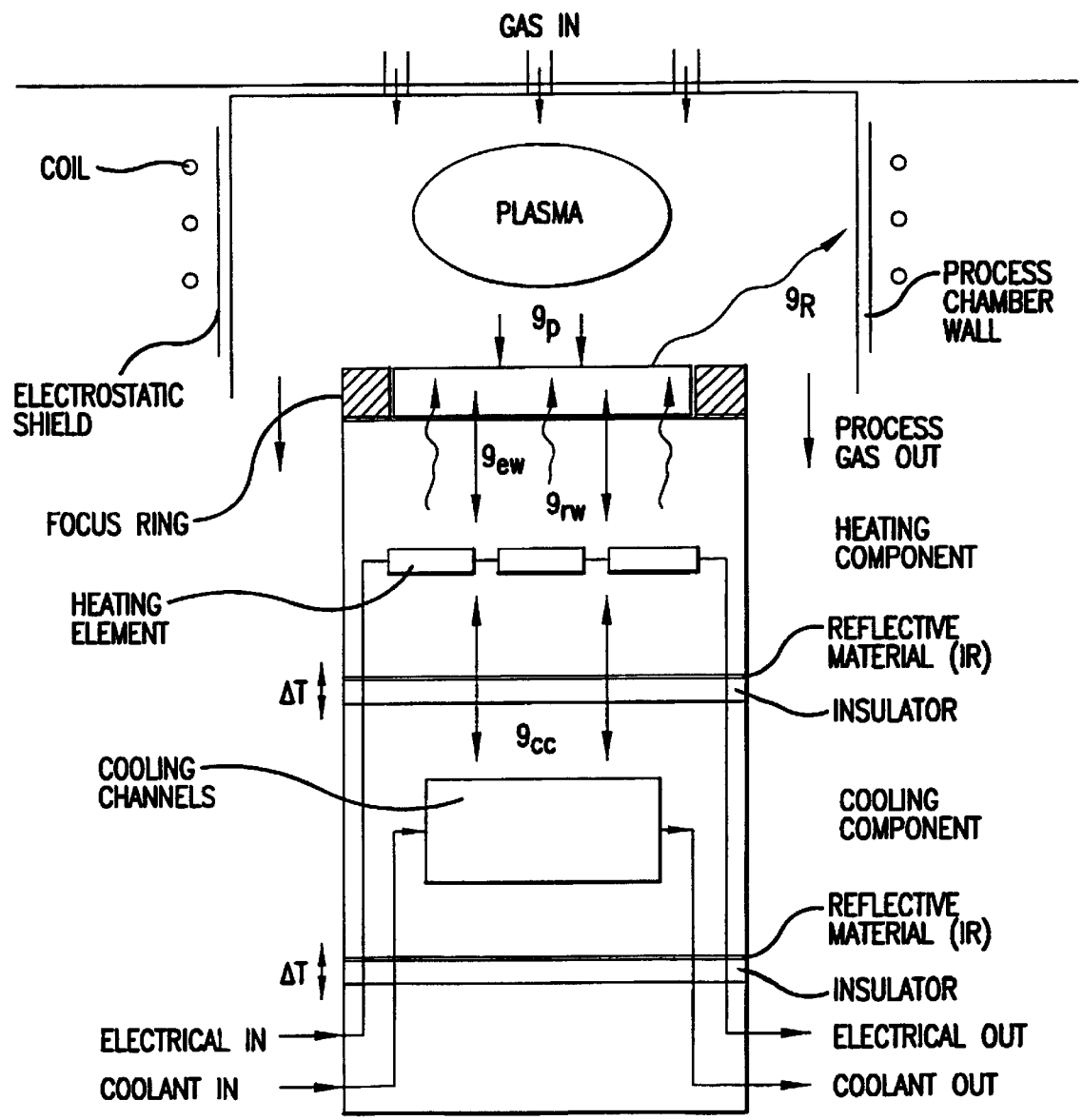
FIG. 13 is a side view of the focus ring and substrate holder in a plasma processing environment.
Figure 14:
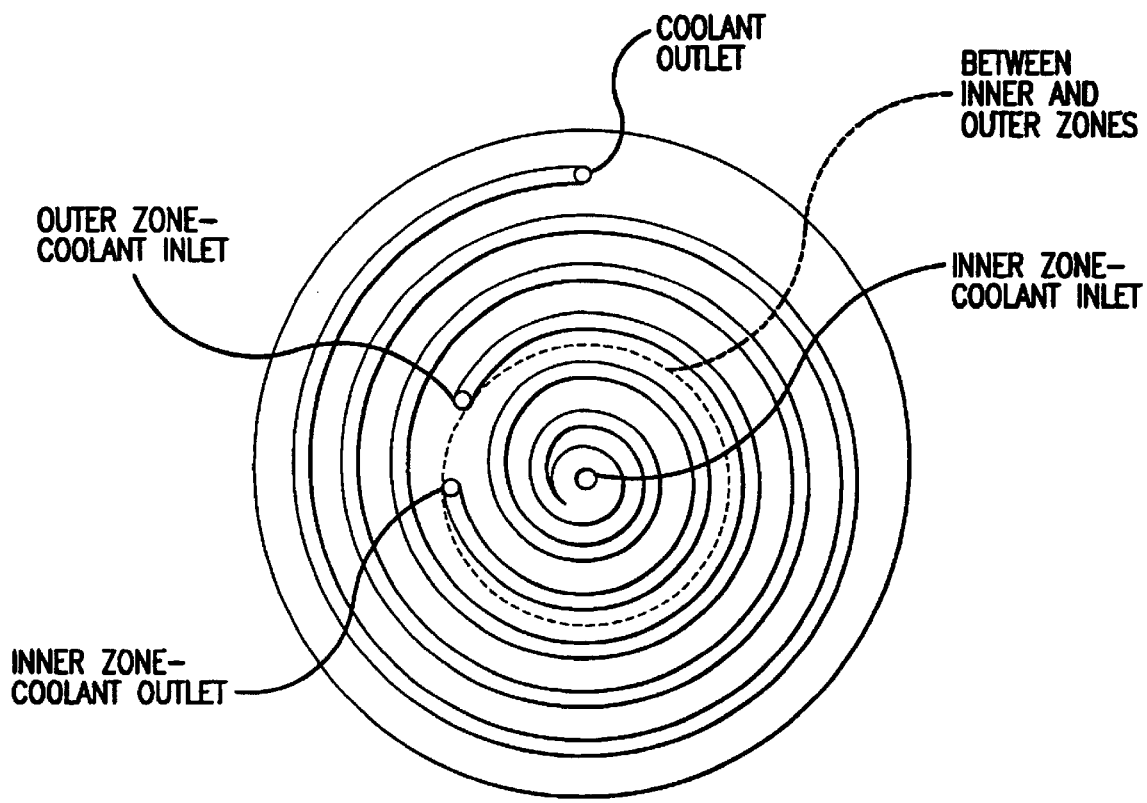
FIG. 14 is a schematic illustration of a substrate holder including a circular inner region surrounded by annular rings, wherein coolant is fed to separate channels that spiral radially outward.

FIG. 13 illustrates the primary heat transfer paths within the process environment of a plasma processing device. In this case, the device is an inductively coupled plasma chamber used for stripping photoresist from a substrate or wafer. There is gas flow into the process chamber and gas flow out. The chamber is surrounded by a helical coil and an electrostatic shield. A plasma is generated by inductively coupling RF power to the chamber. The chuck is illustrated in exaggerated proportions to show a focus ring, heating component, cooling component and chuck base. The wafer, as shown, sits atop the chuck. Starting from the bottom, the chuck base services the heating and cooling components with electrical lines, coolant loops, forced air loops (for the heating element), etc.

The cooling component sits above the chuck base. Coolant flows into, throughout and out of the cooling component. The coolant cools the cooling plate and in turn cools the above structure when coolant is flowing. Heat transfer between the coolant and the cooling plate takes place via forced convection (a conductive-convective heat transfer). The heat that is convected away from the chuck via the coolant is exchanged with a cold water supply in a heat exchanger. In between the cooling component and the chuck base resides an insulator (with a thermal conductivity significantly lower than that of the remaining chuck structure, i.e., an insulating material or a sealed low pressure gas environment where the heat flow between the two chuck components is restricted to an outer ring that is a material with a low thermal conductivity) and a redundant IR reflecting material. The insulator minimizes heat flow from the chuck base into the cooling component via conduction (important when the system is in a cooling mode). Secondly, the IR reflecting material reflects any thermal radiation to the chuck base.

The heating component sits above the cooling component. Again, an insulator and an IR reflecting material are placed between the components. The insulator serves two purposes: (1) it produces a large $\Delta T$ across the interface between the heating component and the cooling component (providing effective cooling without coolant boiling at the channel surfaces), and (2) it improves the thermal response of the heating component, i.e., the thermal inertia of the heating plate is reduced since it does not lose as much heat to the cooling plate which is a large heat sink in this case even when the coolant is not flowing. The adverse effect is that the insulator will hinder the effectiveness of the cooling plate. Therefore, there is an optimal design for this layer. Also, the forced air over the heating element during cool down will improve the cooling response. Heat is exchanged between the heating component and the cooling component via conduction. The heating component heats the wafer via two modes of heat transfer. They are conduction heat transfer and radiation heat transfer. At low heating element temperatures (e.g., 300 degrees C.), the conduction heat transfer is dominant. Above this temperature, radiation heat transfer plays a greater role. In particular, heating the Kanthal element to 1000 degrees C. quickly can enable heating the wafer quickly by means of thermal radiation.

As described, the wafer sits on top of the chuck. The conduction between the chuck and the wafer is limited by the contact between the two surfaces. The heat transfer between the gaps is improved with the use of electrostatic gripping elements and applying the gas to the backside of the wafer. The wafer is also heated by the plasma. Energy is delivered to the wafer surface during the impact of ions at the surface. Furthermore, the wafer can radiatively exchange heat between itself and the chamber walls.

Modifications

As described above, an insulating layer can be placed between the heating plate and the cooling plate which affects the thermal response of a heating/cooling system. One alternative to this configuration is to use a system with a variable heat conductance between the heating plate and the cooling plate. In general, for a quasi-one dimensional conductive heat flow, the conductive heat transfer between components is a function of a heat transfer coefficient, the surface contact area and the temperature difference, i.e., $Q=hA\Delta T$. Therein, the heat transfer coefficient h is dependent upon the quality of contact between the two surfaces. It is true that at higher pressures the heat transfer coefficient is directly related to the gas conductivity and inversely related to the thickness of the gas layer, however, it becomes more complicated at lower pressures. Notably, one may significantly reduce the heat conduction rate between the two surfaces simply by separating the two surfaces such that a layer of low pressure gas resides between them everywhere (i.e., there is no contact at any point between the two surfaces). Therefore, one embodiment employs a variable spacing in order to optimally control the heat transfer between the two opposing surfaces of the two components, i.e., increase the conductive heat transfer by reducing the spacing (even to the point of contact) or decrease the conductive heat transfer by increasing the spacing.

Figure 15:
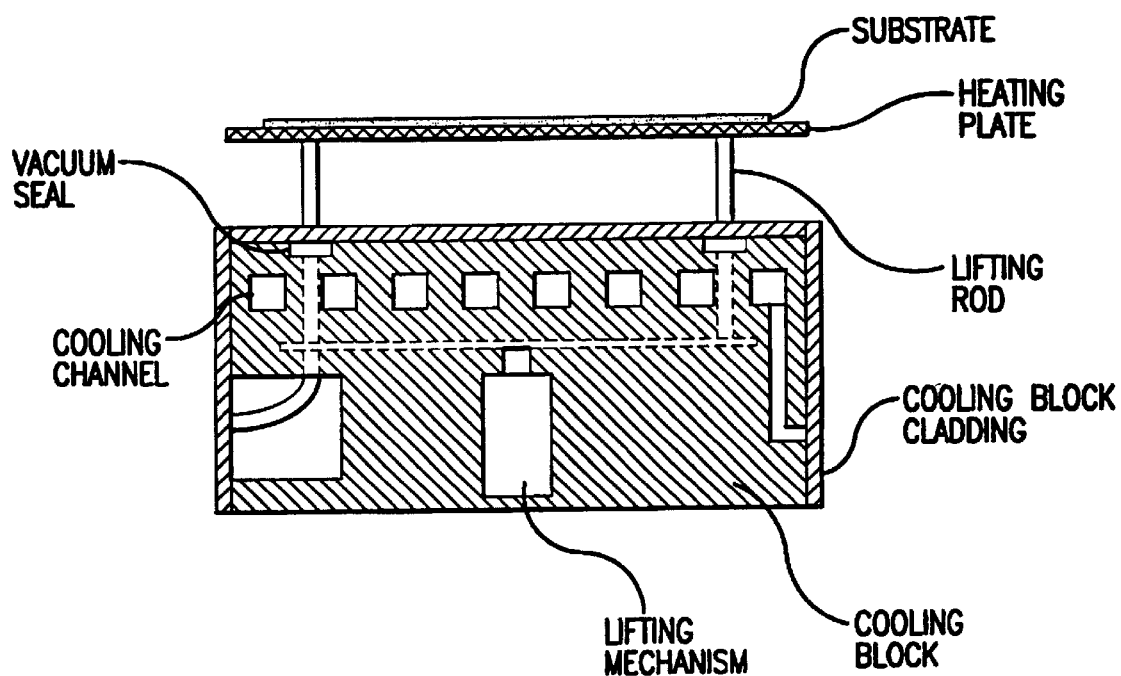
FIG. 15 is a schematic illustration of a heating plate that can be lifted off of the cooling plate.

FIG. 15 is a schematic illustration of a design wherein a heating plate is lifted some (variable) distance above a cooling plate. The wafer is set atop the heating plate. The heating plate may be fused to several (e.g., three) quartz rods that extend into the cooling plate wherein a lifting mechanism actuates their upward and downward movement. The lifting rods (or quartz rods) may serve also as the electrical and/or fluid conduits. Vacuum seals are employed where necessary in order to maintain the chamber vacuum integrity. Furthermore, the cooling plate is larger such that it may house the lifting mechanism. The heater, however, remains completely isolated. The cooling plate may in fact be fabricated from aluminum for high thermal conductivity and clad with materials that accommodate the specific process, e.g., quartz. Coolant may continually flow through the cooling plate in order to maintain it at a pre-specified temperature. During a heating process, the heater (and wafer) may be lifted upwards for high thermal response heating of the wafer. For a cooling process, the power to the heater element may be turned off, during which the heater and wafer can rapidly cool by radiative exchange with the external environment. Upon reaching a temperature of 300 to 500 degree C., the heater may be lowered towards the cooling plate. As the heater approaches, the conductive heat transfer to the cooling plate can increase, hence, further cooling the heater plate. This is referred to as proximity cooling. Ultimately, the heater may be set atop the cooling plate for maximum conductive heat transfer to the cooling plate. The procedure for lifting and lowering the heater (as well as applying power to the heating element) is designed to maximize the thermal response of the heating/cooling system while maintaining safe usage of the heating and cooling plates so as to not thermally shock any component (which may lead to failure). Such lifting and lowering of one layer can also be performed by injecting and removing at least one gas underneath the layer to be moved.

As indicated above, resistance heater elements are preferably formed from a sheet of a Kanthal alloy comprising aluminum, cobalt, chromium, and iron. Other Kanthal alloys may also be used, including those formed from alloys of molybdenum. Materials other than Kanthal alloys may also be used to form resistance heater elements, including tungsten alloys, platinum, and silicon carbide. While using molybdenum, chemical etching is preferred.

Those skilled in the art will now appreciate that an improved multi-zone resistance heater adapted for use in semiconductor wafer reactors has been described. The described resistance heater serves to isolate the resistance heater elements from the processing gas atmosphere, thereby permitting the selection of ideal resistance heater materials without concern as to their degradation at elevated temperatures or the nature and/or pressure of the processing gas. The resistance heater also provides a thermal mass that is only a small multiple of the substrate thermal mass being heated so that the substrate may be heated and cooled quickly. While illustrated as a structure separate from the reactor wall, such resistance heater may optionally be incorporated within the reactor wall.

It is also possible to force air through the channels when using certain materials (e.g., Kanthal) as the heater element. An additional feature of the passage of air through the channels surrounding the heating element is the forced convection cooling of the heating element. For example, when the wafer is to be cooled, power to the heating element is shut off. After which, the heater element radiatively and conductively cools to the surrounding structure. The passage of air through the channels can enhance the cooling of the heating element and reduce the time to remove residual heat in the heater plate.

It is not necessary that the quartz plates be fabricated to encapsulate volumes entirely isolated from the processing vacuum environment. Although the heater element is preferred to be at atmospheric conditions (with an oxygen environment) when the heater element is fabricated from Kanthal, the invention is not limited thereto. In the event that a good seal is not achieved when diffusion bonding the quartz, other materials such as molybdenum can be used as the heater element. Thus, the environment surrounding the element may either be exposed to an inert atmosphere or even a vacuum by separating pumping the volume enclosing the heater element. Access to the volume would be similar to forcing air through the channels when enclosing Kanthal.

Dependent upon the process, it may be preferable to have an alumina chuck versus a quartz chuck. Alumina plates may be fabricated in a manner similar to the fabrication of the quartz plates via grinding and/or etching, etc. The plates may be fused together using alumina frit in a manner similar to fusing quartz. Alumina has similar transmission properties.

In yet another embodiment, the conduits (shown rising through the center of the wafer holder in the figures) are replaced by conduits between layers in any part of the stack. The conduits may even be formed on an exterior edge of the wafer holder such that the conduit arrives at a side edge of each layer. Moreover, a hybrid design with edge connections and center connections can be used to physically separate connections for inner and outer zones.

While the present invention has been described with reference to preferred embodiments thereof, the description is for illustrative purposes only and is not to be construed as limiting the scope of the invention. Various other modifications and changes may be made by those skilled in the art without departing from the true spirit and scope of the invention as defined by the appended claims.

We claim:

1. A heater for heating a substrate in a processing gas within a processing reactor, said heater comprising:
   a first quartz plate having an external face and an internal face opposing said external face,
   a second quartz plate having an internal face, said second quartz plate being disposed proximate and generally parallel to said first quartz plate with the internal face of said first quartz plate substantially adjacent the internal face of said second quartz plate,
   a first heater element;
   a first channel formed in at least one of the internal faces of said first and second quartz plates of a configuration commensurate with that of said first heater element for receiving said first heater element therein;
   a first seal sealing together said first and second quartz plates with said first heater element secured there between, to form a gas-tight chamber (a) between said first and second quartz plates and (b) around the first channel; and
   a first protective gas duct for admitting gas of a predetermined composition and pressure into the first channel independent of the composition and pressure of the processing gas existing externally to the heater.

2. The heater as claimed in claim 1, wherein the gas admitted between the first and second quartz plates is oxygen.

3. The heater as claimed in claim 1, wherein:
   the first quartz plate further comprises a first lift pin hole,
   the second quartz plate further comprises a second lift pin hole in a position corresponding to a position of the first lift pin hole in the first quartz plate,
   the heater further comprising:
      a lift pin for passing through the first and second lift pin holes,
      a second seal for sealing the first and second lift pin holes to each other such that the gas admitted between the first and second quartz plates does not escape through the first and second lift pin holes.

4. The heater as claimed in claim 1, wherein said first heater element comprises a Kanthal alloy.

5. The heater as claimed in claim 4, wherein said Kanthal alloy comprises the elements aluminum, cobalt, chromium, and iron.

6. The heater as claimed in claim 1, wherein said first heater element comprises a tungsten alloy.

7. The heater as claimed in claim 1, wherein said first heater element comprises a material selected from the group consisting of molybdenum, platinum, and silicon carbide.

8. The heater as claimed in claim 1, further comprising a cooling gas injected into the first channel to avoid overheating of the first heater element.

9. The heater as claimed in claim 1, wherein said first heater element comprises a material selected from the group consisting of a chemically etched Kanthal alloy and chemically etched molybdenum.

10. The heater as claimed in claim 1, further comprising electrical conductors extending through said first protective gas duct for coupling said first heater element to a source of electrical power.

11. The heater as claimed in claim 1, wherein the internal face of one of said first and second quartz plates includes a depending flange extending from the periphery thereof, and wherein the internal face of the other of said first and second quartz plates has a recess formed therein along the periphery thereof, said recess engaging said depending flange to aid in the formation of a gas-tight seal there between.

12. The heater as claimed in claim 1, further comprising:
   a third quartz plate;
   a second seal for sealing the third quartz plate to the heater; and
   at least two electrodes between the third quartz plate and the heater for clamping a wafer to the heater.

13. The heater as claimed in claim 1, further comprising:
   a first conduction gas duct for carrying a first conduction gas at a first pressure;
   a third quartz plate including a first conduction gas duct hole for receiving the first conduction gas from the first conduction gas duct and a first set of conduction gas holes in a first region passing the first conduction gas there through to increase conduction to a substrate resting on the heater; and
   a second seal for sealing the third quartz plate to the heater such that the first conduction gas does not pass into the first protective gas duct.

14. The heater as claimed in claim 13, further comprising:
   a second conduction gas duct for conducting a second conduction gas of a second pressure;
   a fourth quartz plate including a second conduction gas duct hole for receiving the second conduction gas from the second conduction gas duct and a second set of conduction gas holes in a second region passing the second conduction gas there through to the substrate,
   a third seal for sealing the third and fourth quartz plates together concentrically such that the first and second pressures of the first and second conduction gases remain independent; and
   wherein the first and second regions are substantially non-overlapping.

15. The heater as claimed in claim 1, wherein
   the first quartz plate further comprises a first set of conduction gas holes in a first region,
   the second quartz plate further comprises a second set of conduction gas holes in the first region, and
   the heater further comprises a second seal for sealing holes of the first set of conduction gas holes to corresponding holes of the second set of conduction gas holes to form a first set of conduction gas channels such that a first conduction gas can be passed through the first set of conduction gas channels.

16. The heater as claimed in claim 15, wherein the first quartz plate further comprises a third set of conduction gas holes in a second region;

the second quartz plate further comprises a fourth set of conduction gas holes in the second region;

the heater further comprises a third seal for sealing holes of the third set of conduction gas holes to corresponding holes of the fourth set of conduction gas holes to form a second set of conduction gas channels such that a second conduction gas can be passed through the second set of conduction gas channels without passing the second conduction gas into either of the first protective gas duct and the first set of conduction gas channels, wherein the first and second regions are substantially non-overlapping.

17. The heater as claimed in claim 13, further comprising:

a second conduction gas duct for carrying a second conduction gas at a second pressure, and wherein the third quartz plate further comprises a second conduction gas duct hole for receiving the second conduction gas from the second conduction gas hole and a second set of conduction gas holes in a second region passing the second conduction gas there through to increase conduction to the substrate, wherein the first and second regions are substantially non-overlapping.

18. The heater as claimed in claim 1, further comprising:

a first coolant entrance duct for carrying a first cooled coolant at a first pressure; a first coolant exit duct for carrying the first coolant after the first coolant has absorbed heat in the heater;

a third quartz plate including a first entrance hole connected to the first coolant entrance duct and a first exit hole connected to the fast coolant exit duct; and a second seal for sealing the third quartz plate to the heater such that the first coolant does not pass into the first protective gas duct.

19. The heater as claimed in claim 18, further comprising:

a second coolant entrance duct for carrying a second cooled coolant at a second pressure;

a second coolant exit duct for carrying the second coolant after the second coolant has absorbed heat in the heater;

a fourth quartz plate including a second entrance hole connected to the second coolant entrance duct and a second exit hole connected to the second coolant exit duct; and a third seal for sealing the fourth quartz plate to the heater such that the second coolant does not pass into the first protective gas duct.

20. A multi-zone heater for heating a substrate in a processing gas within a processing reactor, said multi-zone heater comprising:

a first quartz plate having an external face exposed to the processing gas, said first quartz plate also having an internal face opposing said external face;

a second quartz plate having an internal face, said second quartz plate being disposed proximate and generally parallel to said first quartz plate with the internal face of said first quartz plate substantially adjacent the internal face of said second quartz plate;

a first heater element in a first zone;

a fast channel formed in at least one of the internal faces of said first and second quartz plates of a configuration commensurate with that of said first heater element for receiving said first heater element therein;

a first seal sealing together said first and second quartz plates with said first heater element secured there between, to form a gas-tight chamber between said first and second quartz plates;

a first protective gas duct for admitting gas of a first predetermined composition and pressure into the first channel independent of the composition and pressure of the processing gas existing externally to the heater;

a second heater element in a second zone;

a second channel formed in at least one of the internal faces of said first and second quartz plates having a channel formed therein of a configuration commensurate with that of said second heater element for receiving said second heater element therein:

a second seal sealing together said first and second quartz plates to separate the second heater element secured there between from the first heater element and to provide a gas-tight seal around the second channel; and a second protective gas duct for admitting gas of a second predetermined composition and pressure into the second channel independent of the composition and pressure of the processing gas existing externally to the heater.

21. The heater as claimed in claim 20, wherein the gas admitted in the second duct is oxygen.

22. The heater as claimed in claim 20, wherein said second heater element comprises a Kanthal alloy.

23. The heater as claimed in claim 22, wherein said Kanthal alloy comprises the elements aluminum, cobalt, chromium, and iron.

24. The heater as claimed in claim 20, wherein said second heater element comprises a material selected from the group consisting of platinum, silicon carbide, and a tungsten alloy.

25. The heater as claimed in claim 1, wherein at least one face of the first and second quartz plates are polished plates that enhance flatness.

26. The heater as claimed in claim 1, wherein at least one of the first and second quartz plates are formed using deposition and etching.

27. The heater as claimed in claim 20, wherein said second heater element comprises a chemically etched Kanthal alloy.

28. The heater as claimed in claim 20, further comprising electrical conductors extending through said second protective gas duct for coupling said second heater element to a source of electrical power.

29. The heater as claimed in claim 20, further comprising a third quartz plate;

a third seal for sealing the third quartz plate to the heater; and at least two electrodes between the third quartz plate and the heater for clamping a substrate to the heater.

30. The heater as claimed in claim 12, further comprising:

a capacitance measuring device for measuring a capacitance between two electrodes of the at least two electrodes.

31. The heater as claimed in claim 29, further comprising:

a capacitance measuring device for measuring a capacitance between two electrodes of the at least two electrodes.

32. The heater as claimed in claim 12, further comprising:

a capacitance measuring device for measuring a capacitance between two adjacent electrodes of the at least two electrodes.

33. The heater as claimed in claim 29, further comprising:
a capacitance measuring device for measuring a capacitance between two adjacent electrodes of the at least two electrodes.

34. A heater for heating a substrate in a processing gas within a processing reactor, said heater comprising:
a first alumina plate having an external face and an internal face opposing said external face,
a second alumina plate having an internal face, said second alumina plate being disposed proximate and generally parallel to said first alumina plate with the internal face of said first alumina plate substantially adjacent the internal face of said second alumina plate,
a first heater element;
a first channel formed in at least one of the internal faces of said first and second alumina plates of a configuration commensurate with that of said first heater element for receiving said first heater element therein;
a first seal sealing together said first and second alumina plates with said first heater element secured there between, to form a gas-tight chamber (a) between said first and second alumina plates and (b) around the first channel; and
a first protective gas duct for admitting gas of a predetermined composition and pressure into the first channel independent of the composition and pressure of the processing gas existing externally to the heater.

35. A heater for heating a substrate in a processing gas within a processing reactor, said heater comprising:
a first quartz plate having an external face and an internal face opposing said external face,
a featured quartz spacer having an upper face and a lower face, said spacer being disposed proximate and generally parallel to the internal face of said first quartz, wherein said spacer contains openings forming a channel when fused to the first quartz plate;
a second quartz plate having an upper face and a lower face, said second quartz plate being disposed proximate and generally parallel to the lower face of said spacer;
a first heater element commensurate in shape with that of said channel; and
a first seal sealing together said first quartz plate, said spacer and said second quartz plate, with said first heater element secured there between, to form a gas-tight chamber around the first channel.

36. The heater of claim 35, wherein the openings of the spacer are formed by laser cutting.

37. The heater of claim 35, wherein the openings of the spacer are formed by cutting with a water jet.

38. The heater of claim 35, wherein the openings of the spacer are formed by grinding.

39. A heater for heating a substrate in a processing gas within a processing reactor, said heater comprising:
a first quartz plate having an external face and an internal face opposing said: external face,
a second quartz plate having an internal face, said second quartz plate being disposed proximate and generally parallel to said first quartz plate with the internal face of said first quartz plate substantially adjacent the internal face of said second quartz plate,
a first heater element;
a first channel formed in at least one of the internal faces of said first and second quartz plates for receiving said first heater element therein, wherein the first channel is similar in shape but substantially larger than the first heater element;
a first seal sealing together said first and second quartz plates with said first heater element secured there between, to form a gas-tight-chamber (a) between said first and second quartz plates and (b) around the first channel.

40. A method of manufacturing a substrate holder comprising the steps of etching a quartz plate to form an inlet and an outlet;
etching the quartz plate to form a channel connecting the inlet to the outlet; depositing a metal in the channel, inlet and outlet; and
sealing a plate to the top of the channel to surround the metal.

41. A method of manufacturing a substrate holder comprising the steps of etching a quartz plate to form an inlet and an outlet;
etching the quartz plate to form a channel connecting the inlet to the outlet; depositing a metal in the channel, inlet and outlet; and
depositing quartz above the channel to surround the metal.

42. A multi-layer substrate holder comprising:
a first processing layer comprising a heating element and configured to facilitate a first operation on a substrate being processed;
a second processing layer comprising a cooling element and configured to facilitate a second operation on a substrate being processed; and
a lifting device for separating the first and second processing layers during at least one of the first and second operations.

43. The multi-layer substrate holder as claimed in claim 42, wherein the lifting device is a mechanical lifting device.

* * * * *